(12) United States Patent
Nishimori et al.

(10) Patent No.: US 6,946,847 B2
(45) Date of Patent: Sep. 20, 2005

(54) IMPEDANCE MATCHING DEVICE PROVIDED WITH REACTANCE-IMPEDANCE TABLE

(75) Inventors: Yasuhiro Nishimori, Miki (JP); Shuji Omae, Kobe (JP); Masakatsu Mito, Kobe (JP); Yuji Ishida, Nishinomiya (JP); Koji Itadani, Sanda (JP)

(73) Assignee: Daihen Corporation, Osaka (JP)

( * ) Notice: Subject to any disclaimer, the term of this patent is extended or adjusted under 35 U.S.C. 154(b) by 0 days.

(21) Appl. No.: 10/355,979

(22) Filed: Jan. 30, 2003

(65) Prior Publication Data

US 2003/0184319 A1 Oct. 2, 2003

(30) Foreign Application Priority Data

Feb. 8, 2002 (JP) ........................................ 2002-031774
May 31, 2002 (JP) ........................................ 2002-158980
Aug. 28, 2002 (JP) ........................................ 2002-248824

(51) Int. Cl.$^7$ ........................... G01R 27/00; H03H 7/38
(52) U.S. Cl. ...................................... 324/600; 333/17.3
(58) Field of Search .............................. 333/124, 17.3, 333/32; 702/107; 324/158.1, 520, 525, 754, 755, 761, 176, 76.58, 600, 684, 464, 649, 691, 637, 76.19

(56) References Cited

U.S. PATENT DOCUMENTS

| | | | | |
|---|---|---|---|---|
| 5,195,045 A | * | 3/1993 | Keane et al. ................ 702/107 |
| 5,689,215 A | * | 11/1997 | Richardson et al. ........ 333/17.3 |
| 5,786,737 A | * | 7/1998 | Goto ........................... 333/33 |
| 5,872,456 A | * | 2/1999 | Roderick et al. ........... 324/637 |
| 5,889,252 A | * | 3/1999 | Williams et al. ....... 219/121.54 |
| 5,939,886 A | | 8/1999 | Turner et al. |
| 6,174,450 B1 | * | 1/2001 | Patrick et al. ................ 216/61 |
| 6,291,999 B1 | * | 9/2001 | Nishimori et al. .......... 324/464 |
| 6,424,232 B1 | * | 7/2002 | Mavretic et al. ........... 333/17.3 |
| 6,452,408 B1 | * | 9/2002 | Nakano et al. ............. 324/754 |
| 6,462,622 B1 | * | 10/2002 | Mori et al. ................. 330/302 |
| 6,573,729 B1 | * | 6/2003 | Poulis et al. ................ 324/600 |
| 2002/0044100 A1 | * | 4/2002 | Jagielski et al. ............ 343/850 |

* cited by examiner

Primary Examiner—Vincent Q. Nguyen
Assistant Examiner—Hoai-An D. Nguyen
(74) Attorney, Agent, or Firm—Hamre, Schumann, Mueller & Larson, P.C.

(57) ABSTRACT

An impedance matching device is provided, for which the electric characteristics at an output terminal are accurately analyzed. The matching device is provided with an input detector for detecting RF voltage and current at the input terminal, and an output detector for detecting RF voltage outputted from the output terminal. The matching device also includes a controller for achieving impedance matching between a high frequency power source connected to the input terminal and a load connected to the output terminal. The impedance matching is performed by adjusting variable capacitors based on the detection data supplied from the input detector. When the impedance of the power source is matched to that of the load, the controller calculates the output impedance, RF voltage and RF current at the output terminal, based on the adjusted capacitances of the capacitors, a pre-obtained reactance-impedance data and the detection data supplied from the output detector.

30 Claims, 16 Drawing Sheets

FIG.4

| VC4\VC3 | 0 | 1 | 2 | 3 | 4 | 5 |
|---|---|---|---|---|---|---|
| 0 | 26+j0 | 21+j0 | . | . | . | 1−j0 |
| 1 | 26−j5 | . | . | . | . | . |
| 2 | . | . | . | . | . | . |
| 3 | . | . | . | . | . | . |
| 4 | . | . | . | . | . | 1−j20 |
| 5 | 26−j25 | 21−j25 | . | . | . | 1−j25 |

(0,1) marks position at row 0, column 1 (21+j0)
(5,4) marks position at row 4, column 5 (1−j20)

$R6 = R2 + m \cdot (R3 - R2)$
$R5 = R1 + n \cdot (R6 - R1)$

IMPEDANCE MATCHING DEVICE PROVIDED WITH REACTANCE-IMPEDANCE TABLE

BACKGROUND OF THE INVENTION

1. Field of the Invention

The present invention relates to an impedance matching device used between a high frequency power source and a load. The present invention also relates to a method and a system for analyzing the electric characteristics at an output terminal of an impedance matching device.

2. Description of the Related Art

One of the most important processes performed in producing semiconductor devices or flat panel displays is plasma processing. For generating plasma, a high frequency voltage (RF voltage) of about 100 kHz~300 MHz is applied to a specially designed plasma chamber.

To maximize the power supply to the plasma chamber, it is necessary to match the impedance of the power source and the impedance of the plasma chamber ("load impedance"), so that the reflection power from the chamber to the power source is minimized. To this end, as shown in FIG. 25, use may be made of an impedance matching device 53 arranged between the power source 51 and the plasma chamber 52. The impedance matching device 53 includes an input detector 61, an output detector 62, a controller 63, an inductor L1 (its inductance is also denoted by L1), and variable capacitors (variable reactance elements, or reactors) VC1, VC2.

Input detector 61 includes an RF voltage detecting unit, an RF current detecting unit and a phase difference detecting unit. The voltage detecting unit and the current detecting unit are provided for detecting RF voltage Vi and RF current Ii both inputted to an input terminal 53a of the matching device 53. The phase difference detecting unit is provided for detecting the phase difference θi between the RF voltage Vi and the RF current Ii. The detection results are sent to the controller 63.

The output detector 62 includes an RF voltage detecting unit, an RF current detecting unit and a phase difference detecting unit. The voltage detecting unit and the current detecting unit are provided for detecting RF voltage Vo and RF current Io both outputted at an output terminal 53b of the matching device 53. The phase difference detecting unit is provided for detecting the phase difference θo between the RF voltage Vo and the RF current Io. The detection results sent to the controller 63.

The controller 63 calculates the input impedance Zi of the matching device 53 by using the following equations (1)~(3), on the basis of the detected values Vi, Ii and θi. In the equation (1), Ri and Zi denote the resistance component and the reactance component of the input impedance Zi, respectively.

$$Zi = Ri + jXi \quad (1)$$

$$Ri = (Vi/Ii) \times \cos(\theta i) \quad (2)$$

$$Xi = (Vi/Ii) \times \sin(\theta i) \quad (3)$$

For matching the input impedance Zi and the output impedance Zg of the power source 51, the capacitances of the variable capacitors VC1, VC2 are adjusted (typically the nominal impedance value is 50 Ω). Specifically, the capacitance adjustment can be performed so that the absolute value of Zi (which can be represented as |Zi|) will fall in the prescribed range R. As an alternative, the capacitance adjustment may be performed so that the absolute value of Γi is no greater than a given threshold, where Γi is the reflection coefficient, which is equal to (Zi−Zc)/(Zi+Zc), at the input terminal 53a when the characteristic impedance Zc is 50 Ω.

When the capacitance adjustment is properly performed, the reflection of power at the input terminal 53a is minimized. Accordingly the chamber 52 can receive the maximum power supply.

The impedance of the chamber 52 will be varied by the state of the plasma, for example. Even in this case, the impedance matching can be maintained by the controller 63, which adjusts the capacitances C1, C2 of the capacitors VC1, VC2 on the basis of the detection results supplied from the input detector 61.

The RF voltage Vo, the RF current Io and the phase difference θo are very important numerical factors for knowing the conditions of the plasma treatment. These values are detected by the output detector 62, and then supplied to the controller 63. Based on the supplied data, the controller 63 calculates the output impedance Zo of the impedance matching device 53 by using the following equations (4)~(6).

$$Zo = Ro + jXo \quad (4)$$

$$Ro = (Vo/Io) \times \cos(\theta o) \quad (5)$$

$$Xo = (Vo/Io) \times \sin(\theta o) \quad (6)$$

where Ro and Xo in the equation (4) are the resistance component and the reactance component of the output impedance Zo, respectively. The calculated Zo, together with the RF voltage Vo, the RF current Io and the phase difference θo detected by the output detector 62, is displayed on the monitor or printed on recoding paper.

In the plasma processing, the power source 51 supplies the plasma chamber 52 with an RF power, which may have a frequency of 13.65 MHz, for example. Thus, unwanted high-frequency components occur in the chamber 52, to be outputted to the impedance matching device 53 together with the wave of the basic frequency (i.e., 13.65 MHz). In other word, some noise is mixed into the basic wave. Under this situation, it is difficult to calculate the precise value of the output impedance Zo (or load impedance Zl) on the basis of the detected RF voltage Vo, RF current Io and the phase difference θo. Furthermore, the level of the RF voltage Vo and the RF current Io at the output terminal 53b of the device 53 can change largely as the impedance Zl of the chamber 52 changes. As a result, the detection accuracy of the output detector 62 falls off, whereby the exact value of the output impedance Zo cannot be obtained.

It is possible to calculate an theoretical output impedance without relying on the actual detecting operation by the output detector 62. In this case, the controller 63 performs calculations on the basis of the following equations (7) and (8), where ω is the angular frequency of the RF power supplied from the power source 51.

$$Ro = Ri \times (\omega C1)^2 / B \quad (7)$$

$$Xo = [(Ri)^2 \times (\omega C1)^2 + (Xi + \omega C1) \times \omega C1 \times Xi]/[B + \omega(C2 - L1)] \quad (8)$$

where $$B = (Ri)^2 + (Xi + \omega C1)^2.$$

However, the obtained theoretical value often fails to reflect the actual value of the output impedance Zo. This is because the above equations do not take into consideration influential factors such as a stray capacitance or inductance component inherent to the physical or electrical structure of the matching device 53.

SUMMARY OF THE INVENTION

The present invention has been proposed under the circumstances described above. It is, therefore, an object of the present invention to provide an impedance matching device with which the electric characteristics at the output terminal can be accurately analyzed.

According to a first aspect of the present invention, there is provided an impedance matching device comprising: an input terminal connected to a high frequency power source; an output terminal connected to a load; a reactance circuit including at least one variable reactor, the circuit arranged between the input terminal and the output terminal; an input detector that detects voltage and current of high frequency power inputted to the input terminal; a matching controller that matches impedance of the power source and impedance of the load by adjusting reactance of the variable reactor based on data detected by the input detector; and an analyzer that analyzes electric characteristics at the output terminal based on both data about a particular reactance of the variable reactor and a pre-obtained reactance-impedance data, said particular reactance being chosen so that the impedance of the power source and the impedance of the load are matched to each other. The reactance-impedance data represents relations between data on reactances of the variable reactor and impedance data at the output terminal, the reactance-impedance data being produced with the input terminal connected to the power source or an equivalent of the power source.

Preferably, the matching device may further comprise a storage that stores the reactance-impedance data.

Preferably, the matching device may further comprise an input section for input of the reactance-impedance data when the reactance-impedance data is externally supplied.

Preferably, the matching device may further comprise an output section for output of the electric characteristics analyzed by the analyzer.

Preferably, the matching device may further comprise an interpolation calculator for producing interpolation data by interpolation based on the reactance-impedance data, the interpolation data representing relations between data on reactances of the variable reactor and impedance at the output terminal, wherein the analyzer performs the analysis of the electric characteristics at the output terminal based on said particular reactance and either one of the reactance-impedance data and the interpolation data.

Preferably, the analyzer calculates impedance as the electric characteristics at the output terminal.

Preferably, the analyzer calculates, based on said calculated impedance and detection results by the input detector, high frequency voltage or high frequency current as the electric characteristics at the output terminal.

Preferably, the analyzer calculates, based on said calculated impedance, a phase difference between the high frequency voltage and the high frequency current at the output terminal, the analyzer further calculating, based on the high frequency voltage and the high frequency current detected by the input detector, input power at the input terminal, the analyzer further calculating, based on the input power and said calculated impedance, high frequency voltage or high frequency current at the output terminal on an assumption that the input power is transmitted to the output terminal without loss.

Preferably, the matching device of the present invention may further comprise an actuator for changing the reactance of the variable reactor, wherein the reactance-impedance data includes information about relations between a position of a movable member of the actuator and the impedance at the output terminal.

Preferably, the impedance data included in the reactance-impedance data comprises impedance measured as viewed from the output terminal toward the power source.

Preferably, the impedance data is obtained by measuring output impedance of the matching device using an impedance measuring device as the reactance of the variable reactor is changed, with the input terminal connected to a dummy load and the output terminal connected to the impedance measuring device.

Preferably, the matching device may further comprise an interpolation calculator that produces output impedance interpolation data by interpolation using the output impedance measured by the impedance measuring device.

Preferably, the interpolation includes proportional operation using the output impedance measured by the impedance measuring device.

Preferably the impedance data included in the reactance-impedance data comprises impedance measured as viewed from the output terminal toward the load.

Preferably, the impedance data is obtained by connecting the power source to the input terminal via a power meter, connecting a variable dummy load to the output terminal, causing the power source to supply high frequency electric power, adjusting the variable dummy load so that the power of the reflected wave is minimized for a given reactance of the variable reactor, and measuring the adjusted impedance of the dummy load by an impedance measuring device.

Preferably, the matching device may further comprise an interpolation calculator for producing impedance interpolation data by interpolation based on the impedance measured by the impedance measuring device.

Preferably, the matching device may further comprise an output detector for detecting either one of high frequency voltage and high frequency current outputted to the load from the output terminal, wherein the analyzer performs the analysis of the electric characteristics at the output terminal based on the data about said particular reactance, the reactance-impedance data and detection results by the output detector.

Preferably, the matching device may further comprise an interpolation calculator that produces interpolation data representing relations between data on the reactance of the variable reactor and impedance data at the output terminal, the interpolation data being obtained by interpolation using the reactance-impedance data, wherein the analyzer performs the analysis of the electric characteristics at the output terminal based on detection results from the output detector, data on said particular reactance and either one of the reactance-impedance data and the interpolation data.

Preferably, the matching device may further comprise an actuator for changing the reactance of the variable reactor, wherein the reactance-impedance data includes information about relations between a position of a movable member of the actuator and the impedance at the output terminal.

Preferably, the analyzer calculates impedance at the output terminal based on data about said particular reactance and the reactance-impedance data, the analyzer further calculating a phase difference between high frequency voltage and high frequency current at the output terminal based on the calculated impedance, the analyzer further calculating, based on the calculated phase difference, the calculated impedance and either one of the high frequency voltage and current detected by the output detector, the remaining one of the high frequency voltage and current.

Preferably, the analyzer calculates impedance at the output terminal based on data about said particular reactance and either one of the reactance-impedance data and the interpolation data, the analyzer further calculating a phase difference between high frequency voltage and high frequency current at the output terminal based on the calculated impedance, the analyzer further calculating, based on the calculated phase difference, the calculated impedance and either one of the high frequency voltage and current detected by the output detector, the remaining one of the high frequency voltage and current.

According to a second aspect of the present invention, there is provided an impedance matching system comprising an impedance matching unit and an output characteristics analyzing unit. The matching unit includes: an input terminal connected to a high frequency power source; an output terminal connected to a load; at least one variable reactor arranged between the input terminal and the output terminal for matching impedances of the power source and the load; an input detector that detects voltage and current of high frequency power supplied from the power source; and a matching controller that matches the impedance of the power source and the impedance of the load by adjusting reactance of the variable reactor based on detection data from the input detector. The analyzing unit includes: a storage that stores reactance-impedance data representing relations between data on the reactance adjusted by the matching controller and data on the impedance at the output terminal; and an analyzer that analyzes electric characteristics at the output terminal based on both data about the reactance adjusted by the matching control and the reactance-impedance data.

Preferably, the analyzer of the analyzing unit performs the analysis of the electric characteristics at the output terminal based on data on the reactance adjusted by the matching controller, detection results from the input detector and the reactance-impedance data.

Preferably, the system may further comprise an output detector arranged in the impedance matching unit for detecting either one of high frequency voltage and high frequency current outputted from the output terminal to the load.

Preferably, the analyzer of the analyzing unit performs the analysis of the electric characteristics at the output terminal based on data on reactance adjusted by the matching controller, detection results from the output detector and the reactance-impedance data.

Preferably, the electric characteristics at the output terminal includes at least one of output impedance of the matching unit, impedance of the load, high frequency voltage at the output terminal and high frequency current at the output terminal.

Preferably, the system may further comprise a display arranged in the analyzing unit for visually presenting analysis data supplied from the analyzer.

According to a third aspect of the present invention, there is provided a method of analyzing electric characteristics at an output terminal of an impedance matching device provided with an input terminal and a variable reactor arranged between the input terminal and the output terminal. The method comprising: producing reactance-impedance data while the input terminal is connected to a high frequency power source, the reactance-impedance data representing relations between data on reactance of the variable reactor and data on impedance at the output terminal; supplying high frequency electric power to the input terminal while the input terminal is connected to the power source and the output terminal is connected to a load; detecting high frequency voltage and high frequency current at the input terminal; adjusting reactance of the variable reactor based on data on the detected high frequency voltage and current, so that the impedance of the power source and the impedance of the load are matched to each other; and analyzing the electric characteristics at the output terminal by using data on the adjusted reactance and the reactance-impedance data.

Preferably, the analysis of the electric characteristics at the output terminal is performed based on data on the high frequency voltage and current detected at the input terminal, data on the adjusted reactance and the reactance-impedance data.

Preferably, the method may further comprise detecting either one of high frequency voltage and high frequency current at the output terminal, wherein the analysis of the electric characteristics at the output terminal is performed based on detection data at the output terminal, data on the adjusted reactance and the reactance-impedance data.

Other features and advantages of the present invention will become apparent from the detailed description given below with reference to the accompanying drawings.

BRIEF DESCRIPTION OF THE DRAWINGS

FIG. 4 illustrates the data stored in EEPROM;

DETAILED DESCRIPTION OF THE PREFERRED EMBODIMENT

Preferred embodiments of the present invention will be described below with reference to the accompanying drawings.

Figure 1:
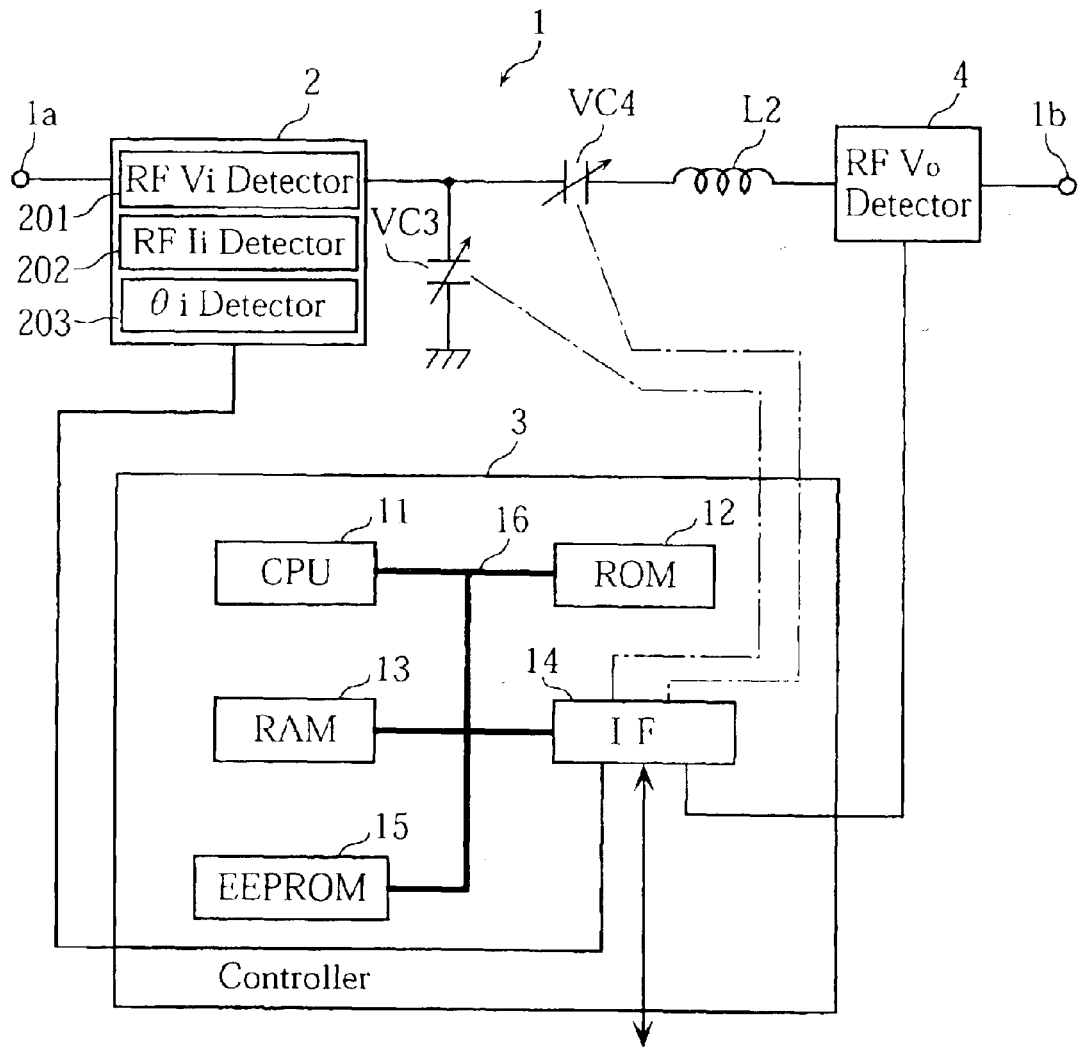
FIG. 1 is a block diagram showing an impedance matching device according to the present invention.

FIG. 1 is a circuit diagram showing the principal components of an impedance matching device 1 according to a first embodiment of the present invention. The impedance matching device 1 includes an input terminal 1a connected to a high-frequency power source (not shown) and an output terminal 1b connected to a plasma chamber (not shown). The device 1 is provided for matching the impedance Zg of the power source and the impedance Zl of the plasma chamber.

As shown in FIG. 1, the impedance matching device 1 is provided with a multitasking detector 2 connected to the input terminal 1a, a controller 3, an RF voltage detector 4 connected to the output terminal 1b, an inductor L2, and variable capacitors VC3, VC4 (serving as variable reactance elements). The inductor L2 and the capacitors VC3, VC4 constitute a reactance circuit (or matching circuit) of the present invention.

The controller 3 controls the overall operation of the impedance matching device 1. The controller 3, including a CPU 11, a ROM 12, a RAM 13, an input/output interface 14, and an EEPROM 15, can operate as a microcomputer. As shown in FIG. 1, the CPU 11, the ROM 12, the RAM 13, the interface 14, and the EEPROM 15 are connected to each other by bus lines 16.

The multitasking detector 2 detects RF voltage Vi and RF current Ii both inputted to the input terminal 1a. The detector 2 also detects the phase difference θi between the RF voltage Vi and the RF current Ii. For accomplishing these detections, the detector 2 is provided with an RF voltage detecting circuit 201, an RF current detecting circuit 202 and a phase difference detecting circuit 203. The detected RF voltage Vi, RF current Ii and phase difference θi are sent to the controller 3.

The RF voltage detector 4 detects the RF voltage Vo at the output terminal 1b. The detected RF voltage Vo is sent to the controller 3.

The controller 3 calculates the input impedance Zi of the impedance matching device 3 on the basis of the detected RF voltage Vi, RF current Ii and phase difference θi. This calculation can be performed by the equations (1)~(3) discussed with reference to the prior art.

$$Zi = Ri + jX \tag{1}$$

$$Ri = (Vi/Ii) \times \cos(\theta i) \tag{2}$$

$$Xi = (Vi/Ii) \times \sin(\theta i) \tag{3}$$

Further, the controller 3 adjusts the variable capacitors VC3, VC4 so that the absolute value of the input impedance Zi will fall within the prescribed range R (50±5 Ω, for example).

According to the present invention, the adjustment of the capacitors VC3, VC4 can be performed in some other manners. For instance, supposing that the characteristic impedance Zc is 50 Ω, a first option may be that the controller 3 calculates the absolute value of the reflection coefficient Γi[=(Zi−Zc)/(Zi+Zc)] and then adjusts the variable capacitors VC3, VC4 so that |Γi| is no greater than the prescribed threshold (0.2, for example). A second option may be that the controller 3 calculates a standing-wave ratio ρ[=(1+|Γi|)/(1−|Γi|)] at the input terminal 1a and then adjusts the variable capacitors VC3, VC4 so that ρ is no greater than the prescribed threshold (1.1, for example).

Based on data (to be described later) stored in the EEPROM 1, the capacitances C3, C4 and the RF voltage Vo at the output terminals 1b, the controller 3 calculates the impedance Zl of the plasma chamber, the output impedance Zo of the matching device 1, and the RF current Io at the output terminal 1b of the device 1. Also, the controller 3 calculates the phase difference θo between the RF voltage Vo and the RF current Io. These calculated pieces of data and the actually detected RF voltage Vo may be displayed on the monitor connected to the impedance matching device 1.

As being operated by the programs stored in the ROM 12, the CPU 11 controls the overall operation of the controller 3. The ROM 12 stores programs for running the CPU 11 and data required for executing the programs. The RAM 13 provides a work area for allowing the CPU 11 to execute the programs. Also, the RAM 13 temporarily stores data necessary for performing the required calculations and data obtained by certain processing.

The interface 14 controls the data flow to or from the CPU 11. The detected RF current Ii and RF voltage Vi, t phase difference θi, and the detected RF voltage Vo are inputted to the CPU 11 through the interface 14. Further, the calculated electric properties (the impedance Zl of the plasma chamber, the output impedance Zo of the matching device 1, the RF current Io, and the phase difference θo between the voltage Vo and the current Io) and the detected RF voltage Vo are displayed on the monitor externally connected via the interface 14.

The CPU 11 outputs control signals to the variable capacitors VC3, VC4 via the interface 14 for impedance matching between the power source and the plasma chamber. Based on these control signals, the capacitances C3, C4 of the capacitors VC3, VC4 will be adjusted step-by-step. In the illustrated embodiment, the capacitances of the respective capacitors can be varied through 100 incremental steps. To this end, each of the capacitors VC3, VC4 is connected to a stepping motor. More specifically, each capacitor includes two parallel conductors separated by an insulator, and only one of the conductors is connected to a stepping motor. The CPU 11 controls the stepping motor so that the overlapping area of the two facing conductors is reduced or increased for the adjustment of capacitance.

The EEPROM 15 stores "data" required for calculating the chamber's impedance Zl, the RF current Io at the output terminal 1b, and the phase different θo between the RF voltage Vo and the RF current Io. This particular data (called "output impedance calculation data" below) relates to the output impedance Zo of the matching device 1 connected to the high-frequency power source. The output impedance Zo shows various values as the capacitance of the capacitor VC3 or VC4 is altered for the step-by-step adjustment. The output impedance calculation data carries information on the variation of the output impedance Zo corresponding to the respective incremental changes in the capacitance of the capacitors VC3, VC4. According to the present invention, the output impedance calculation data may be stored in a nonvolatile memory such as a flash memory in place of the EEPROM 15.

Figure 2:
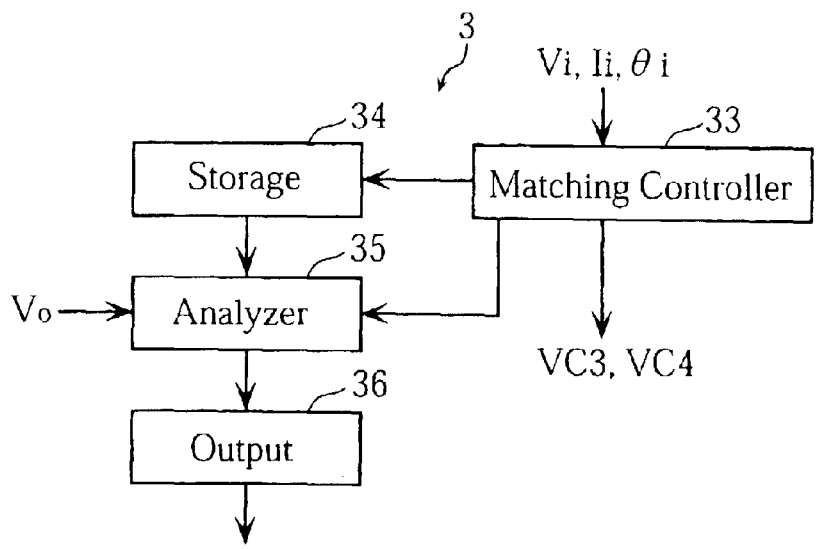
FIG. 2 is a block diagram showing the function of the controller.

FIG. 2 is a block diagram illustrating the function of the controller 3. The controller 3 includes a matching section 33, a storage section 34, an analysis section 35, and an output section 36.

The matching section 33 varies the capacitances C3, C4 of the capacitors VC3, VC4 in accordance with the values Vi, Ii and θi detected by the multitasking detector 2. Thus, the impedance Zg of the power source 31 is matched to the impedance Zl of the plasma chamber 32. The matching section 33 is realized by the CPU 11.

The storage section 34 stores a pre-obtained "capacitance-impedance table" representing the relationship between the capacitances C3, C4 (an example of "impedance information") and the output impedance Zo of the matching device 1 or the load impedance Zl. As mentioned above, the capacitances C3, C4 may be adjusted by stepping motors connected to the capacitors VC3, VC4. Thus, the above capacitance-impedance table may contain the rotation angles of the stepping motors (another example of the "impedance information") in place of the capacitances C3, C4. The storage section 34 is realized by the EEPROM 15.

When the matching process by the matching section 33 is completed, the analysis section 35 calculates the impedance Zl of the chamber 32 on the basis of the current values of the capacitances C3, C4 and the capacitance-impedance table stored in the storage section 34. Further, the analysis section 35 calculates the phase difference θo between the RF voltage Vo and the RF current Io on the basis of the obtained impedance Zl, while also calculating the RF current Io on the basis of the impedance Zl, the phase difference θo, and the RF voltage Vo, which is detected by the voltage detector 4. The analysis section 35 is realized by the CPU 11.

The output section 36 causes the analyzed results of the electrical properties (the impedance Zl, the RF voltage Vo, the RF current Io, the phase difference θo) to be supplied to the externally connected monitor, for example. The output section 36 is realized by the interface 14.

Figure 3:
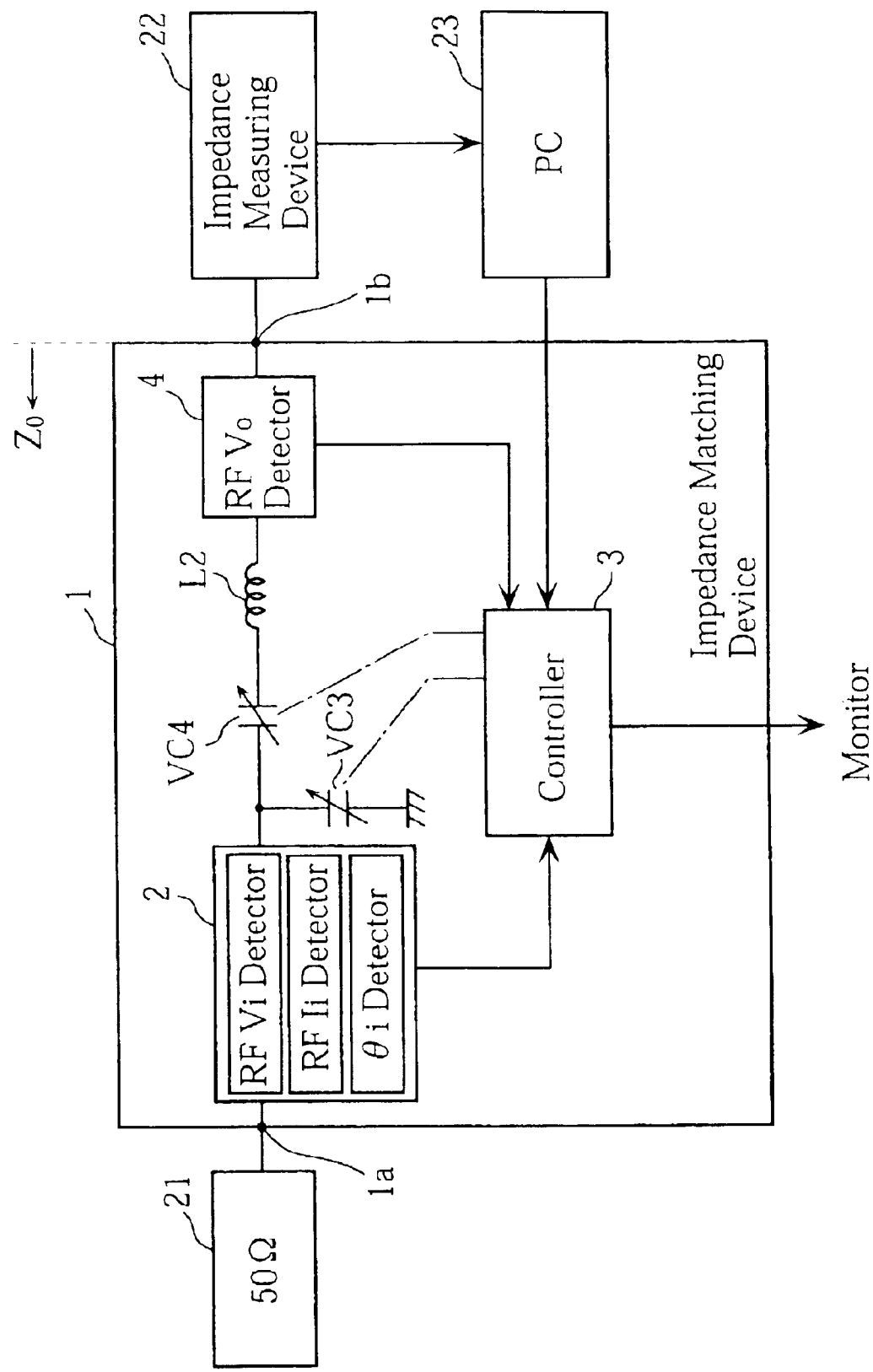
FIG. 3 illustrates a way to produce data for calculating the output impedance.

FIG. 3 shows an example of measuring system for obtaining the above-mentioned capacitance-impedance table. As illustrated, the input terminal 1a of the matching device 1 is connected to a resistor 21, while the output terminal 1b is connected to an impedance measuring device 22. The interface 14 of the controller 3 is connected to a personal computer 23. The resistor 21 (50 Ω in the illustrated example) represents the power source and/or connection cable actually connected to the matching device 1.

With the use of the measuring system, the capacitance-impedance table may be generated by allowing the capacitances C3, C4 of the capacitors VC3, VC4 to be changed step-by-step by the controller 3 and measuring the output impedance Zo of the matching device 1 each time the capacitance C3 or C4 is altered. When each of the capacitors VC3 and VC4 takes 100 different capacitances, a total of 10,000 capacitance pairs are provided for the impedance measurement. The measured impedance data may be in the form of 'Ro+jXo' (=Zo), though the present invention is not limited to this. For instance, $|Zo|$ and θo may be measured, and then the resistance component Ro and reactance component Xo may be calculated by the following equations.

$$Ro = |Zo| \times \cos(\theta o) \quad (9)$$

$$Xo = |Zo| \times \sin(\theta o) \quad (10)$$

The 10,000 pieces of impedance data are automatically collected by the personal computer 23 in a manner such that each piece of impedance data is related to a corresponding pair of the capacitances C3 and C4. The collected data is stored in the EEPROM 15 in the form of a table shown in FIG. 4. The illustrated table, for simplicity of illustration, contains only six adjustable options (numbered 0~5) for each of the capacitances C3, C4. The integers 0~5 correspond to the rotational angle of a stepping motor to vary the capacitance of the capacitor C3 or C4.

The intersection of a column (relevant to the capacitance C3) and a row (relevant to the capacitance C4) in the table gives one pair of the capacitances of the respective capacitors VC3 and VC4, and in the table this pair is linked to the measured value of the output impedance Zo. As an example, when the capacitance of the capacitor VC3 takes the value in Column 0 and the capacitance of the capacitor VC4 takes the value in Row 1, the intersection of the column and the row can be represented by an ordered pair "(0, 1)." In this instance, the table shows that the measured output impedance Zo is "26−j5." As another example, when the capacitance pair of the two capacitors VC3, VC4 is represented by "(5, 4)", the measured output impedance Zo is "1−j20."

Figure 5:
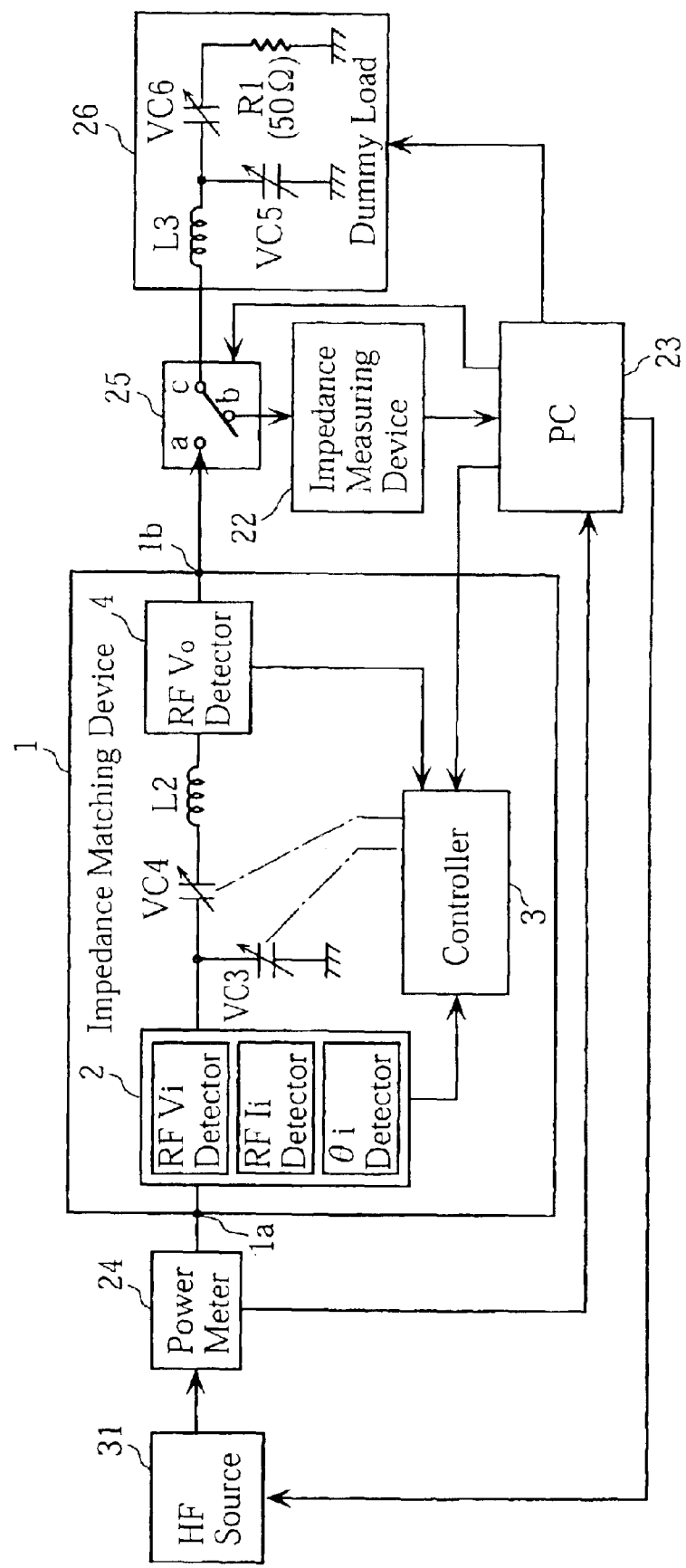
FIG. 5 illustrates another way to produce data for calculating the output impedance.

FIG. 5 shows a second example of measuring system for obtaining the above-mentioned capacitance-impedance table. By this example, the input terminal 1a of the matching device 1 is connected to a power meter 24 which in turn is connected to the power source 31. The output terminal 1b of the matching device 1 is connected to a switch 25 which in turn is connected to a dummy load 26 and an impedance measuring device 22. The data measured by the power meter 24 is sent to the computer 23, and the output of the power source 31 is controlled by the computer 23. Under the control of the computer 23, the switch 25 selectively connects the dummy load 26 to either the output terminal 1b of the matching device 1 or the impedance measuring device 22.

The dummy load 26, corresponding to the load impedance Zl of the plasma chamber, includes an inductor L3 and variable reactance elements or capacitors VC5, VC6, wherein one end of the inductor L3 is connected to the switch 25, the other end being connected to the capacitors VC5, VC6. The capacitor VC6 terminates at a resistor R1 of 50 Ω (thus, the characteristic impedance of the measuring system is 50 Ω). The capacitances C5, C6 of the variable capacitors VC5, VC6 are adjusted by the computer 23. Each of the capacitances C5, C6 can be varied step-by-step to take 100 different values, for example. The change of the capacitances C5, C6 simulates the variation of the load impedance Zl of the plasma chamber. In this embodiment, as in the above-described embodiment, it is possible to specify any pair of the capacitances of the respective capacitors VC5, VC6 by the notation "(α, β)," where α and β are an integer (0~99) corresponding to one of the 100 adjustable capacitances of the capacitors C5 and C6, respectively.

With the use of the above measuring system, the desired "capacitance-impedance table" may be produced in the following manner.

First, the switch 25 is operated to connect the dummy load 26 to the output terminal 1b of the matching device 1. Then, the capacitances C3, C4 of the capacitors VC3, VC4 are set at the values represented by the above-introduced notation (0, 0). Likewise, the capacitances of the capacitors VC5, VC6 are set at the values represented by (0, 0).

Then, the power source 31 is turned on to supply the predetermined high-frequency electric power. The reflection power at the input terminal 1a is detected by the power meter 24, and the measured result is sent to the computer 23.

As monitoring the reflection power, the computer 23 varies the capacitances C5, C6 to find the particular capacitances C5, C6 that minimize the reflection power (the power of the reflected waves). The minimization of the reflection power signifies that the impedance of the power source 31 is matched to the impedance of the dummy load 26.

In order to find the particular capacitances that minimize the reflection power, the variable capacitors VC5, VC6 may be changed so that they take all the possible capacitance combinations. Preferably, the capacitance change of the capacitors VC5, VC6 may be performed systematically in a manner such that either one of the capacitors is fixed in a given capacitance, while the other is increased incrementally in its capacitance from the smallest to the highest value. By this scheme, the capacitance change goes through all the possible capacitance combinations, namely, (0, 0), (0, 1), (0, 2), . . . , (0, 99), (1, 0), (1, 1), . . . , (1, 99), . . . , (99, 0), (99, 1), . . . , (99, 99).

After the reflection power measurement with respect to all the capacitance combinations is over, the computer 23 singles out one particular capacitance combination that minimizes the reflection power. Then, the computer 23 sets the capacitances of the capacitors VC5, VC6 at the reflection power-minimizing values. According to the present invention, the above extensive reflection power measurement may be replaced by a more laborsaving scheme whereby the reflection power measurement is terminated when a detected value of the reflection power is below a predetermined threshold.

After the capacitances of the capacitors VC5, VC6 are set at the reflection power-minimizing values, the HF power source 31 is turned off, and the switch 25 is operated to connect the dummy load 26 to the input terminal of the impedance measuring device 22 to measure the impedance of the dummy load 26. The result of the measurement is inputted to the computer 23.

The computer 23 records the supplied impedance data as the matched load impedance Zl in relation to the tentatively adjusted capacitances of the variable capacitors VC3, VC4. This recorded data corresponds to the impedance value for (0, 0) in the table of FIG. 4. It should be noted, however, that the impedance shown in FIG. 4 is the output impedance Zo of the matching device 1, while the impedance measured by the measuring device of FIG. 5 is the load impedance simulating the impedance Zl of the plasma chamber. Thus, the impedance measured by the system of FIG. 5 corresponds to the conjugate of the impedance shown in the table of FIG. 4.

The above-described procedure is repeated for the other capacitance combinations of the variable capacitors VC3, VC4 (that is, (0, 1), (0, 2), and so forth). Thus, a table similar to that shown in FIG. 4 is produced and written to the EEPROM 15.

In the above embodiment, the measurement of the output impedance Zo or load impedance Zl is performed with respect to all the capacitance combinations of the capacitors VC3, VC4. However, this scheme is rather time-consuming and often requires a large memory.

To cope with the problems, the actual measurement of the output impedance Zo of the matching device may be performed only with the selected ones of the capacitance combinations of the variable capacitors VC3, VC4. For the other, non-selected capacitance combinations, the output impedance Zo is calculated by interpolation. The calculations for the interpolation may be carried out in parallel with the actual measurement of the output impedance Zo or after the entire process of the actual measurement is completed.

Figure 6:
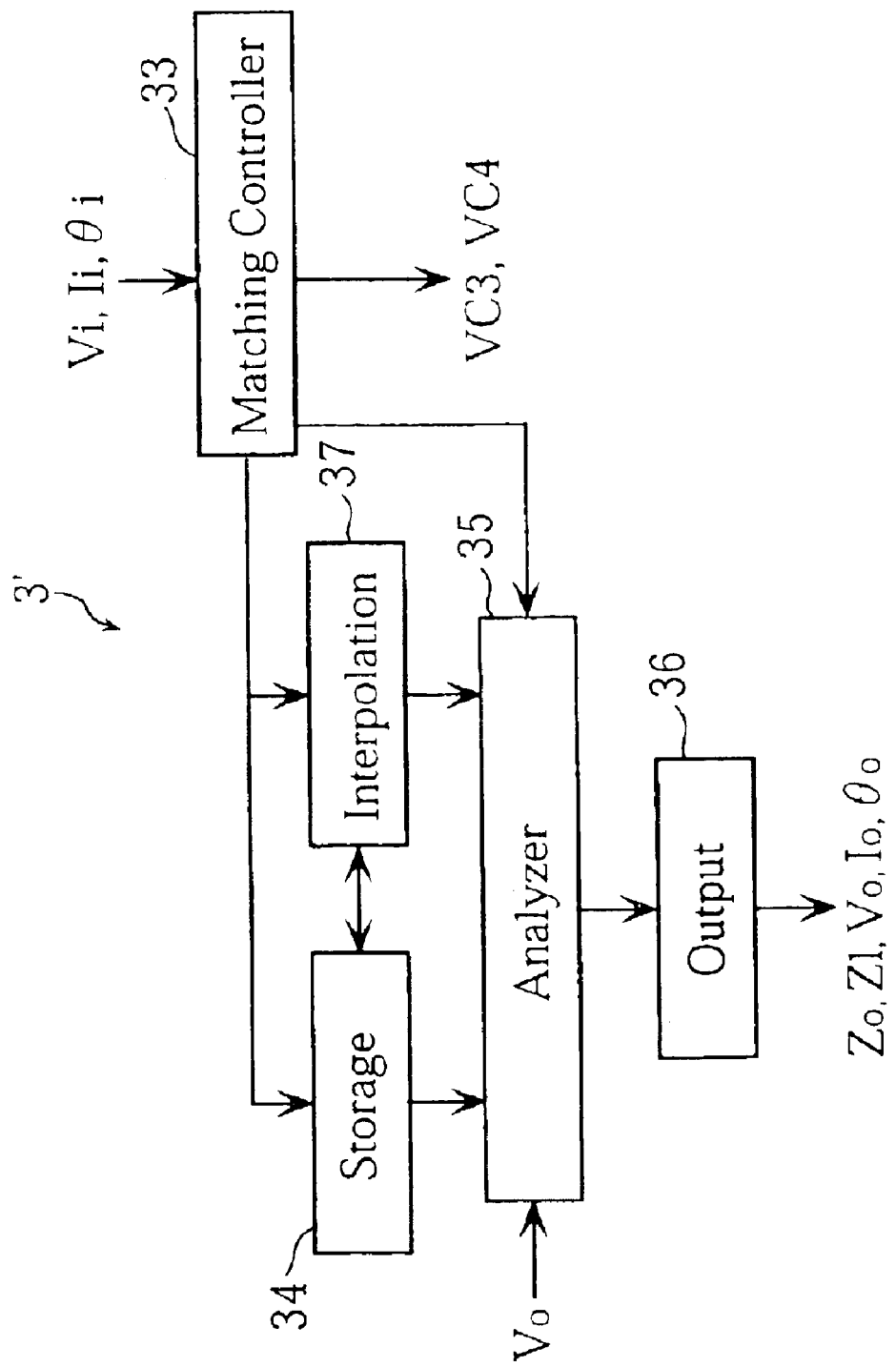
FIG. 6 is a block diagram showing the function of the controller of an impedance matching device according to another embodiment of the present invention.

FIG. 6 is a block diagram illustrating the function of a controller 3' that performs the above-mentioned interpolation. The controller 3' is provided by integrating an interpolation calculating section 37 into the controller 3 shown in FIG. 2. The interpolation calculating section 37 is realized by the CPU 11. The storage section 34 stores data on the actually measured output impedance Zo (or load impedance Zl). The interpolation calculation for the non-measured output impedance Zo is performed at the section 37.

Figure 7:
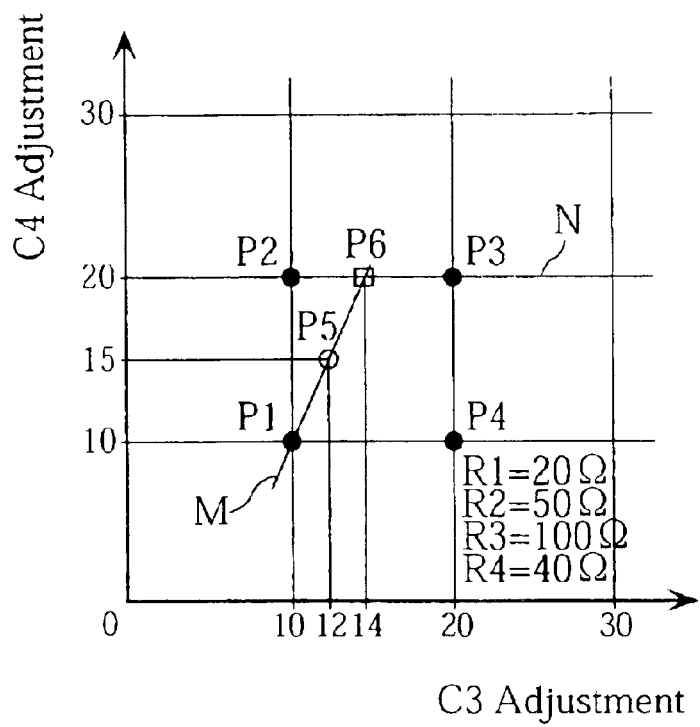
FIG. 7 illustrates how the required interpolation is performed.
Figure 8:
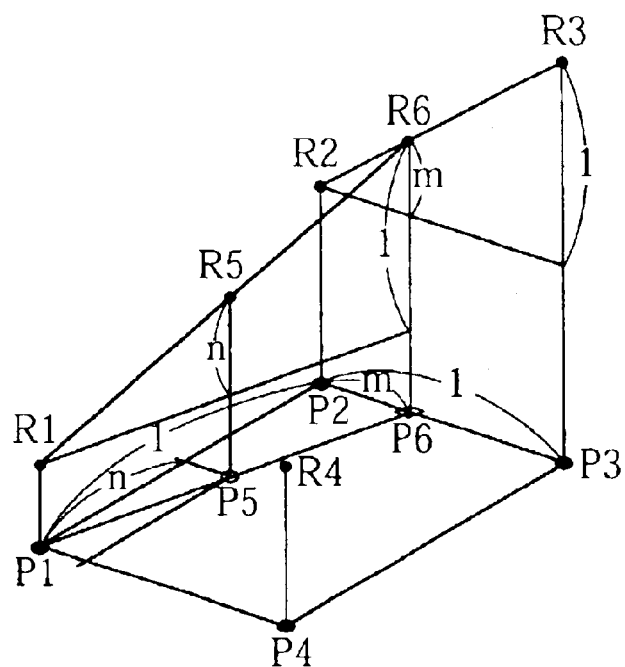
FIG. 8 shows relations between the actually detected resistance components R1–R3 and the calculated resistance components R5–R6.

FIGS. 7 and 8 illustrate how the interpolation is performed. The abscissa of the graph shown in FIG. 7 represents the variable capacitance of the capacitor VC3, while the ordinate represents the variable capacitance of the capacitor VC4. The black circles P1~P4 show that the output impedance Zo (or load impedance Zl) are actually measured. On the other hand, the outlined circle P5 shows that the load impedance Zl should be calculated by interpolation.

The resistance component R5 of the output impedance Zo at P5 may be calculated in the following manner.

First, a straight line M connecting the point P1 and the point P5 and another straight line N connecting the point P2 and the point P3 are drawn The intersection of the straight lines M and N is designated as P6. Then, the calculation of the resistance component R6 of the impedance corresponding to the point P6 is performed on the basis of the resistance component R2 of the point P2 and the resistance component R3 of the point P3. Then, based on the obtained resistance component R6 and the resistance component R1 of the point P1, the resistance component R5 of the point P5 is calculated.

FIG. 8 shows the relationship between the resistance components R1~R3 (actually measured) and the resistance components R5~R6 (to be calculated). The vertical direction of the figure corresponds to the resistance component.

Supposing that the ratio of the P2–P3 distance to the P2–P6 distance is 1 to m(<1) and the ratio of the P1–P6 distance to the P1–P5 distance is 1 to n(<1), the resistance component R6 of the point P6 can be calculated by the formula R2+m×(R3−R2). Also, the resistance component R5 of the point P5 can be calculated by the formula R1+n×(R6−R1). From these formulas, the resistance component R5 of the point P can be expressed as R5=(1−n)× R1+n×(1−m)×R2+n×m×R3. In the illustrated example, m is equal to 0.4, n is equal to 0.5, R1 is equal to 20, R2 is equal to 50, and R3 is equal to 100. Thus, the resistance component R5 of the point P5 is calculated to be 45.

Figure 9:
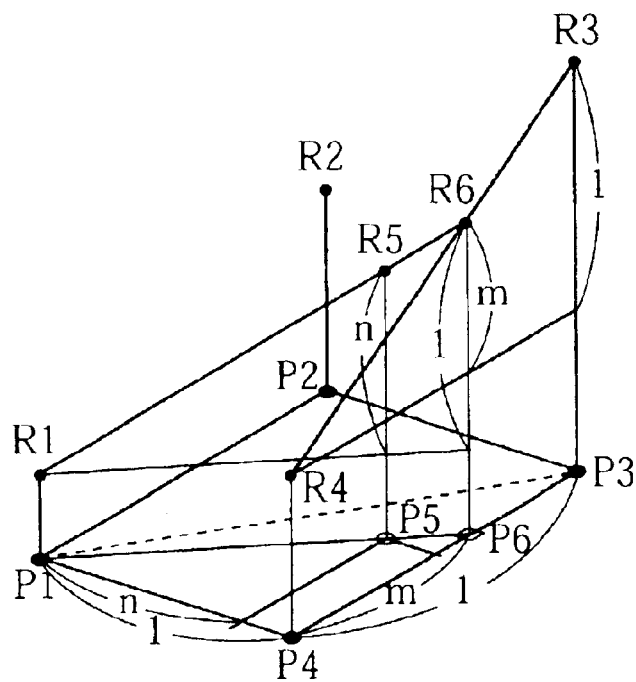
FIG. 9 shows relations between the actually detected resistance components R1, R3, R4 and the calculated resistance components R5–R6.

In the example shown in FIG. 7, the point P5 is included within the triangular region defined by the points P1~P3, and therefore the resistance component R5 is calculated on the basis of the measured values of the points P1~P3. Likewise, when the point P5 is included within a triangular region defined by the points P1, P3 and P4, as shown in FIG. 9, then the resistance component R5 is calculated on the basis of the measured values of the points P1, P3 and P4.

Following the same calculation process as described above, it is possible to calculate the reactance component X5 of the point P5.

Figure 10:
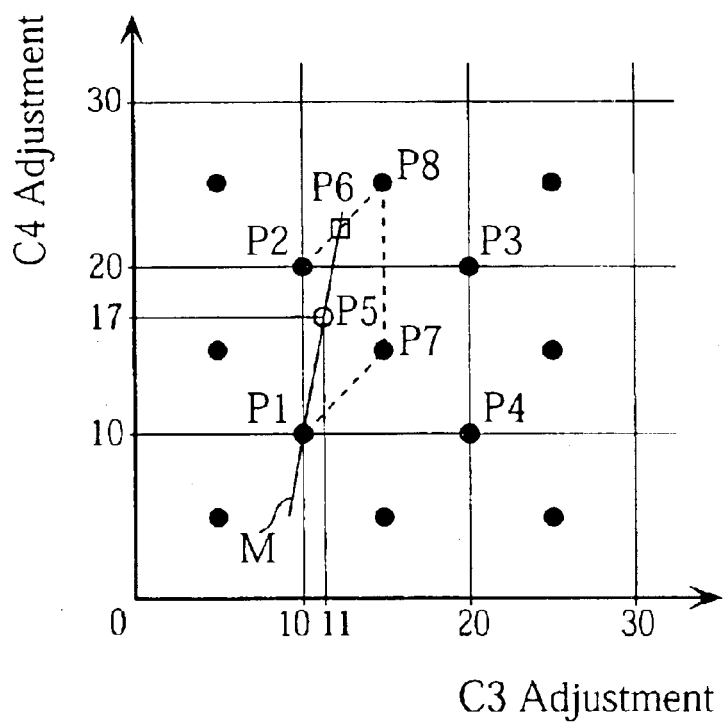
FIG. 10 illustrates a modified interpolation operation.

In the example of FIG. 7, the point P5 is located in the rectangular region defined by the points P1~P4. Referring to FIG. 10, the point P5 is located in a parallelogram defined by the points P1~P4. Even in such a case, the resistance component R5 of the point P5 can be calculated on the basis of the resistance components R1 and R6 in the same manner as described above.

The function of the impedance matching device 1 will be described below.

Figure 11:
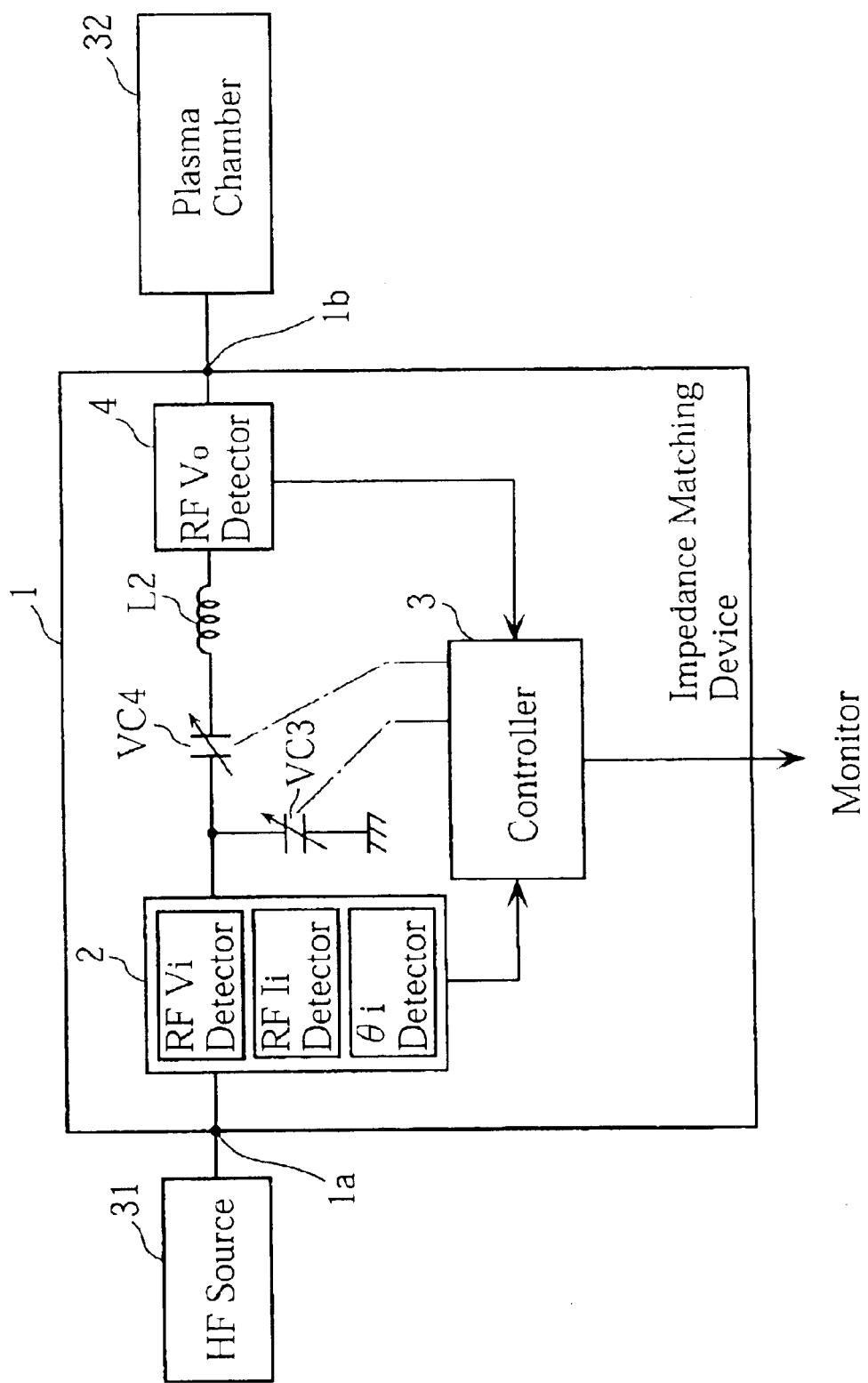
FIG. 11 shows how the impedance matching device is actually used.

Referring to FIG. 11, the input terminal 1a of the matching device 1 is connected to the high frequency power source 31, while the output terminal 1*b* is connected to the plasma chamber 32. The controller 3 incorporates, among other things, an EEPROM for storing a capacitance-impedance table that links the possible combinations of the capacitances C3, C4 to the output impedance Zo.

In the example shown in FIG. 7, the point P5 is included within the triangular region defined by the points P1~P3, and therefore the resistance component R5 is calculated on the basis of the measured values of the points P1~P3. Likewise, when the point P5 is included within a triangular region defined by the points P1, P3 and P4, as shown in FIG. 9, then the resistance component R5 is calculated on the basis of the measured values of the points P1, P3 and P4.

Following the same calculation process as described above, it is possible to calculate the reactance component X5 of the point P5.

In the example of FIG. 7, the point P5 is located in the rectangular region defined by the points P1~P4. Referring to FIG. 10, the point P5 is located in a parallelogram defined by the points P1~P4. Even in such a case, the resistance component R5 of the point P5 can be calculated on the basis of the resistance components R1 and R6 in the same manner as described above.

The function of the impedance matching device 1 will now be described below.

Referring to FIG. 11, the input terminal 1*a* of the matching device 1 is connected to the high frequency power source 31, while the output terminal 1*b* is connected to the plasma chamber 32. The controller 3 incorporates, among other things, an EEPROM for storing a capacitance-impedance table that links the possible combinations of the capacitances C3, C4 to the output impedance Zo.

First, the impedance matching device 1 performs the impedance matching of the high frequency power source 31. Specifically, the multitask detector 2 detects the RF voltage Vi, the RF current Ii, and the phase difference θi (between the RF voltage Vi and the RF current Ii) that are inputted to the terminal 1*a* of matching device 1. The detected Vi, Ii and θi are inputted to the controller 3. The controller 3 calculates the input impedance Zi by the above equations (1)~(3) on the basis of the RF voltage Vi, RF current Ii and phase difference θi. Further, the controller 3 adjusts the capacitances C3, C4 of the variable capacitors VC3, VC4 so that the absolute value of the input impedance Zi falls in a predetermined range (for example, 50±5 Ω).

Alternatively, the capacitances C3, C4 may be adjusted so that the absolute value of the reflection coefficient (|Γi|) at the input terminal 1*a* becomes smaller than the predetermined threshold (0.2, for example). The reflection coefficient Γi is calculated by the equation Γi=(Zi−R0)/(Zi+R0), where Zi=Ri+jXi, and R0 is the output impedance (nominal value) of the power source 31 or the characteristic impedance of the coaxial cable. As another option, the adjustment of the variable capacitances C3, C4 may be performed so that a standing-wave ratio ρ falls within the predetermined range (smaller than 1.1, for example), where the ρ is equal to (1+|Γi|)/(1−|Γi|).

Next, the CPU 11 of the controller 3 reads out the output impedance Zo corresponding to the adjusted values of the capacitances C3, C4, from the capacitance-impedance table stored in the EEPROM 15. Taking the case of FIG. 4 for example, the output impedance Zo to be read out will be "21−j25" when the adjusted values of the capacitors VC3, VC4 are "1" and "5", respectively.

Then, the CPU 11, calculates the conjugate impedance of the output impedance Zo (the conjugate is the impedance Zl of the plasma chamber 32). When Zo is 21−j25, for example, the conjugate impedance Zl of the plasma chamber 32 is 21+j25. According to the present invention, the capacitance-impedance table in the EEPROM 15 may contain the impedances Zl of the plasma chamber 32 instead of the output impedances Zo.

Furthermore, the CPU 11, based on the calculated impedance Zl and the RF voltage Vo (detected by the RF voltage detector 4) will calculate the RF current Io at the output terminal 1*b* and also the phase difference θo between the RF voltage Vo and the RF current Io. This computation proceeds in the following manner.

First, the CPU 11 calculates the phase difference θo (at the output terminal 1*b*) between the RF voltage Vo and the RF current Io, on the basis of the calculated load impedance Zl (=Ro−jXo). The phase difference θo is calculated by the following equation:

$$\theta o = \tan^{-1}(Xo/Ro) \qquad (11)$$

As shown by the above-mentioned formulas (5) and (6), the RF voltage Vo, the RF current Io, the phase difference θo and the load impedance Zl(=Ro−jXo) satisfy such relations as Ro=(Vo/Io)×cos (θo) and Xo=(Vo/Io)×sin (θo). From these, the RF current Io can be expressed as:

$$Io = (Vo/Ro) \times \cos(\theta o) \qquad (12)$$

$$= (Vo/Xo) \times \sin(\theta o) \qquad (13)$$

By using the formulas (12) and (13), the CPU 11 calculates the RF current Io on the basis of the calculated phase difference θo and load impedance Zl and also the detected RF voltage Vo.

Then, the CPU 11 supplies the externally connected display with the data such as the impedance Zl(=Ro−jXo), the phase difference θo, the RF voltage Vo and the RF current Io.

According to the above embodiment, the RF current Io and the phase difference θo are obtained on the basis of the actually detected RF voltage Vo and the pre-obtained capacitance-impedance table. In this manner, it is possible to precisely know the electric characteristics at the input terminal of the plasma chamber 32.

Figure 12:
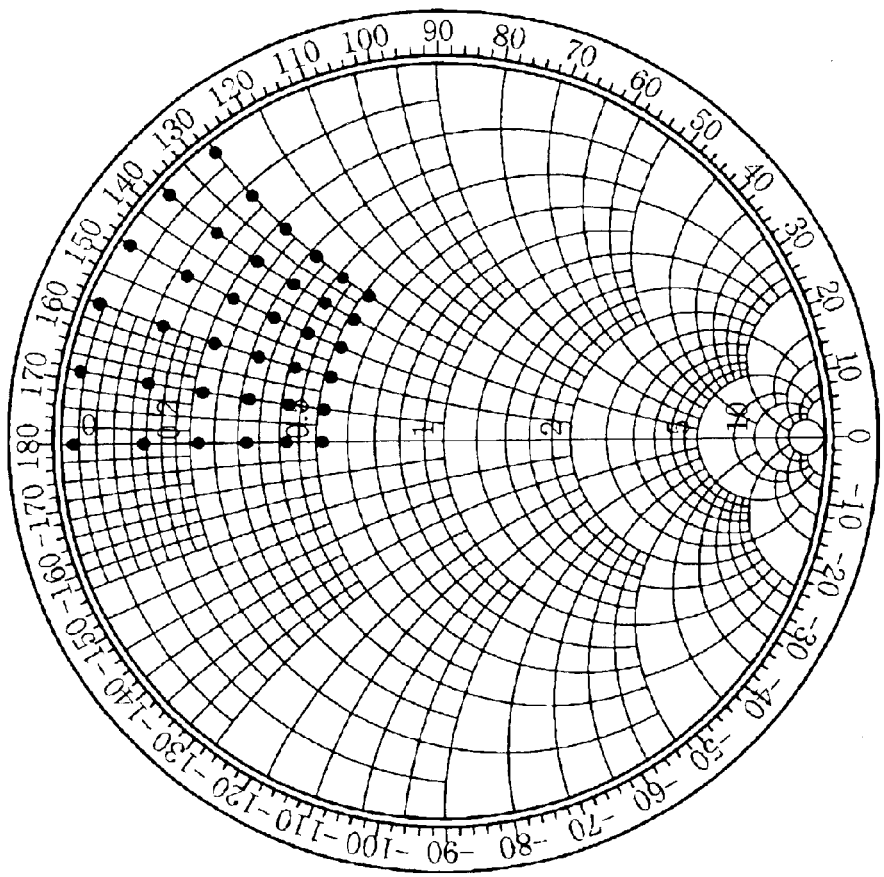
FIG. 12 is a Smith chart illustrating the adjustment range of the impedance of the plasma chamber connected to the impedance matching device of the present invention.

The data acquired through the impedance measuring device 22 can be used for showing the adjustable range of the impedance Zl of the plasma chamber 32, as shown in FIG. 12. The black dots in the figure represent the measurements obtained by the measuring device 22. By referring to the measurement range (r and x are 0~0.5, it is possible to know the adjustable range of the output impedance Zo of the impedance matching device 1.

Figure 13:
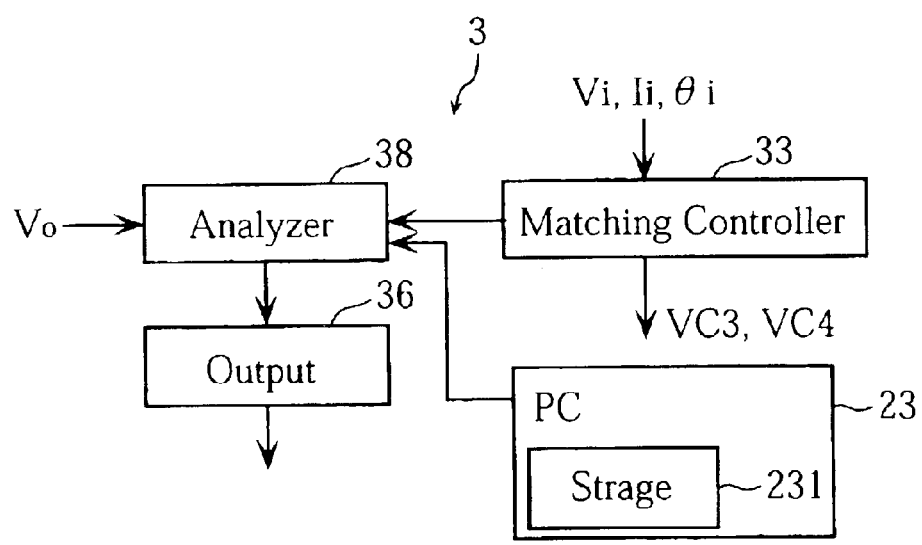
FIG. 13 is a block diagram showing the function of the controller of an impedance matching device according to another embodiment of the present invention.

FIG. 13 is a functional block diagram showing the controller 3 of the impedance matching device according to a third embodiment of the present invention. In this embodiment, the capacitance-impedance table is not stored in the impedance matching device, but supplied from outside when the required analysis of the electric characteristics is performed.

Specifically, the pre-obtained capacitance-impedance table is stored in the RAM 231 of the external computer 2. Although not shown in FIG. 13, the computer 23 is connected to the controller 3 through the interface 14. When the matching process by the matching control section 33 is completed, the capacitance-impedance table is sent to the analysis section 38 from the computer 23. Based on the table, the detected RF voltage Vo and the adjusted capacitances C3, C4, required calculations are performed to produce the data on the electric characteristics such as the impedance Zl of the chamber 32, the RF current Io at the output terminal 1b and the phase difference θo between the RF voltage Vo and the RF current Io.

With the above arrangement, the computer 23 stores the capacitance-impedance table, and therefore there is no need to provide the storage section 34, the interpolation section 37, or the EEPROM 15 in the matching device 1. The matching section 33 and the analysis section 38 are realized by the CPU 11.

Figure 14:
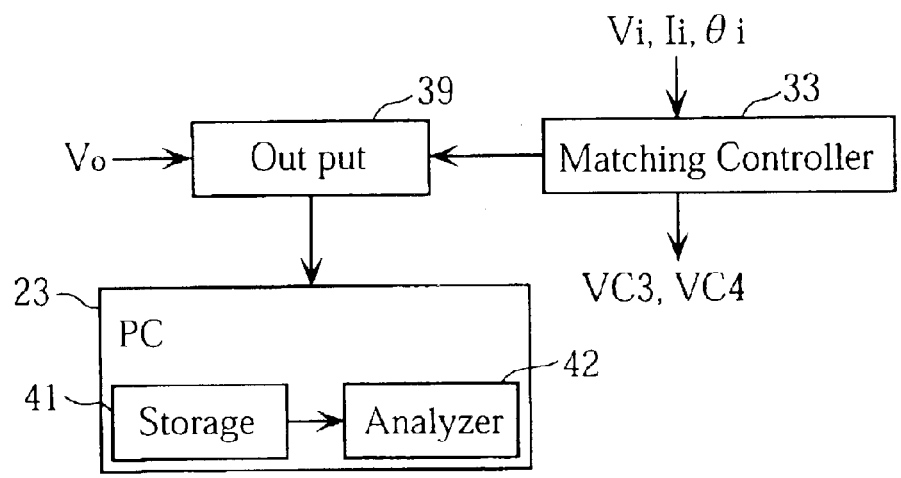
FIG. 14 is a block diagram showing an output characteristics analyzing system of the present invention.
Figure 15:
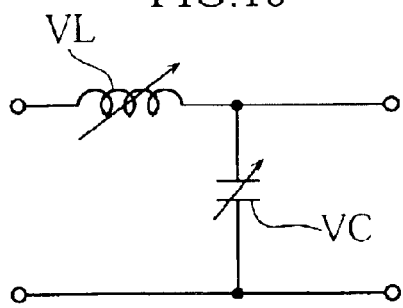
FIGS. 15–18 show some examples of variable reactors.
Figure 16:
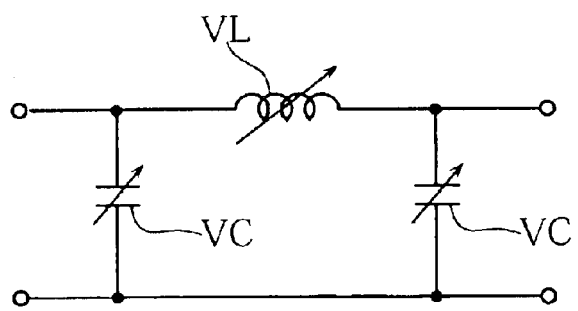
Figure 17:
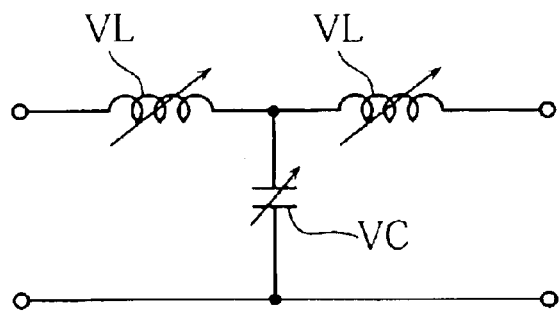
Figure 18:
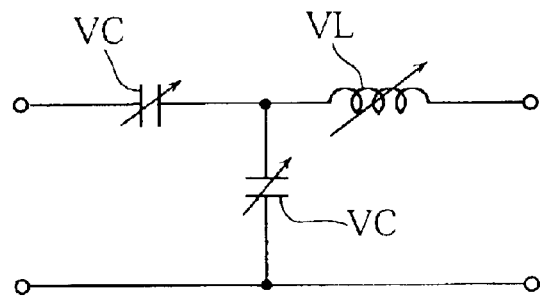

FIG. 14 is the functional block diagram showing an output characteristic analysis system of an impedance matching device according to the present invention. The illustrated system includes a matching section 33 and an output section 39 both together for performing the required impedance matching, while also including a computer 23 for analyzing the output characteristics.

When the matching section 33 completes the impedance matching process, the output section 39 supplies the computer 23 with the current values of the capacitances C3, C4 and the detected voltage Vi, current Ii and phase difference θi. The analysis section 42 of the computer 23 calculates the impedance Zl of the chamber 32, the RF current Io at the output terminal 1b and the phase difference θo, on the basis of the supplied data and the capacitance-impedance table in the storage section 41. The calculated data may be displayed on the non-illustrated monitor.

In the above case again, the computer 23 may be arranged to perform interpolation based on partial data defining the relation between the capacitances C3, C4 and the impedance Zo, so that the non-listed capacitance-impedance relation can be obtained by calculation.

In the above embodiments, the capacitors VC3, VC4 are used as variable reactance elements. As shown in FIGS. 15~18, use may be made of variable inductors VL in place of the capacitors. The circuit may be structured as a T type or π type. Only one or more than two variable reactance elements may be used for providing the required circuit.

Figure 19:
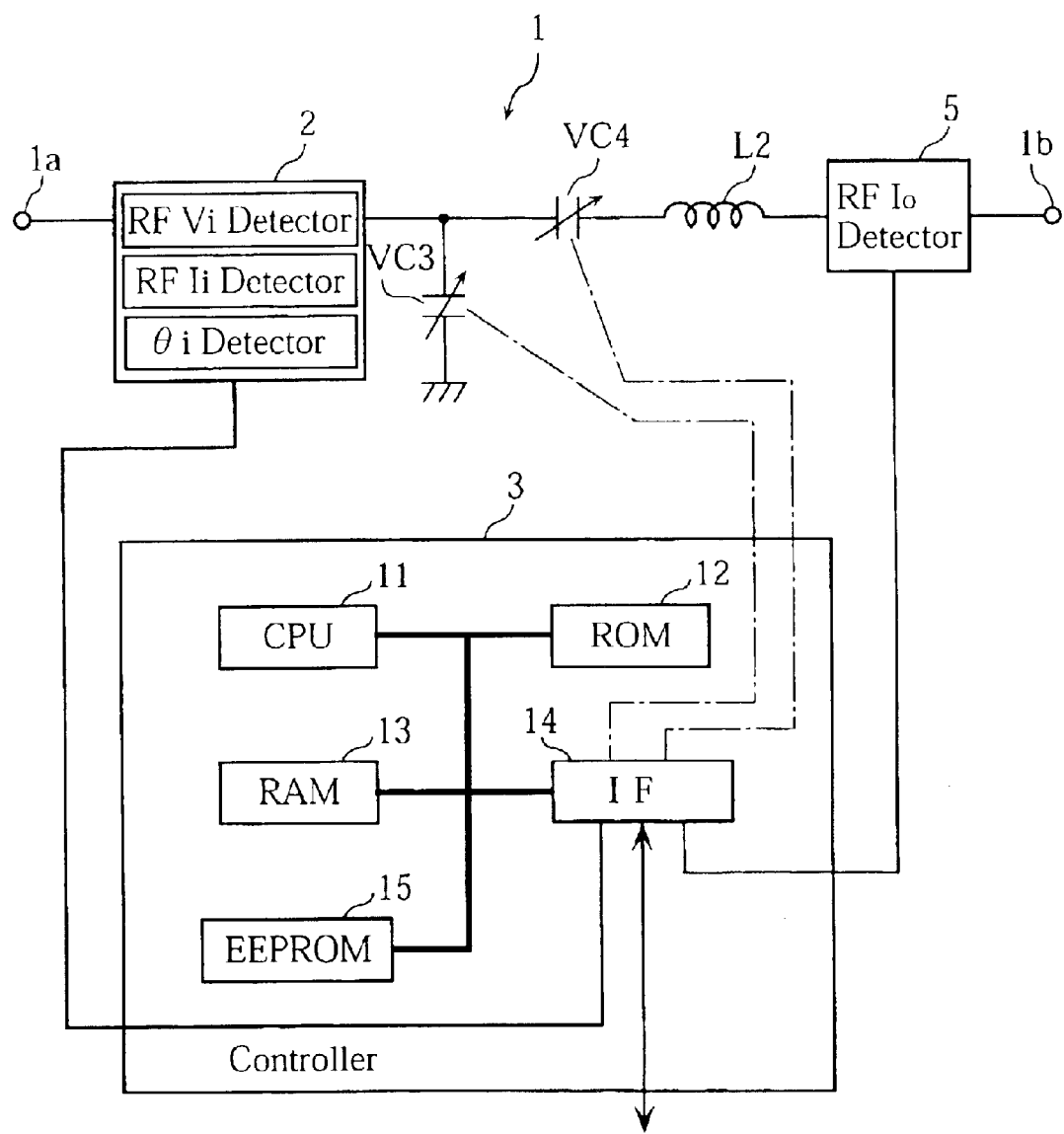
FIG. 19 is a block diagram showing an impedance matching device according to another embodiment of the present invention.

In the above embodiment, the RF voltage Vo outputted from the matching device 1 is detected by the voltage detector 4, though the present invention is not limited to this. For instance, as shown in FIG. 19, an RF current detector 5 may be provided for performing the direct detection of the RF current Io outputted from the matching device 1. In this case, the RF voltage Vo at the output terminal 1b can be calculated by the following equation (14) or (15), based on both the load impedance Zl(=Ro−jXo) known from the pre-obtained capacitance-impedance table and the actually detected RF current Io.

$$Vo = (Ro \times Io)/\cos(\theta o) \qquad (14)$$

$$= (Xo \times Io)/\sin(\theta o) \qquad (15)$$

Figure 20:
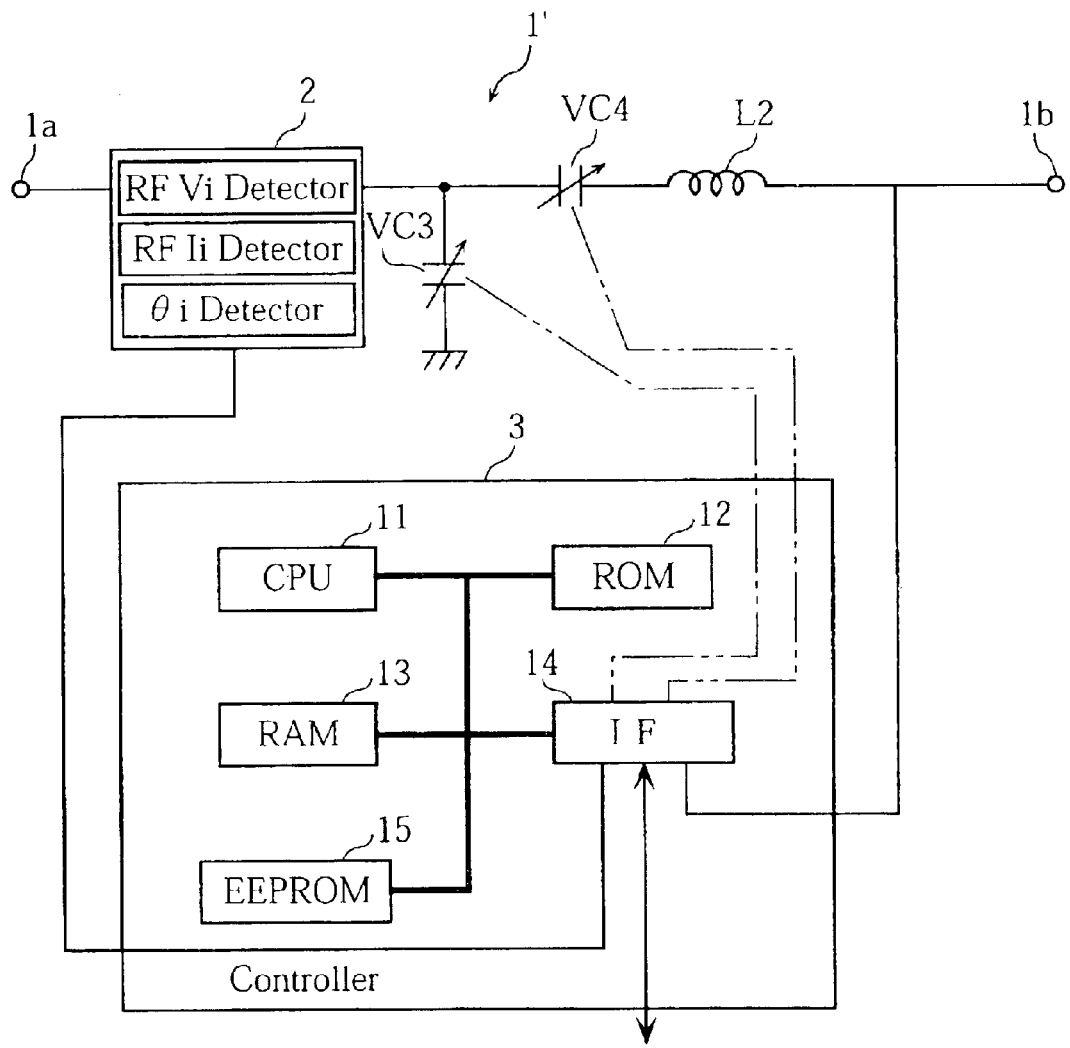
FIG. 20 is block diagram showing an impedance matching device according to another embodiment of the present invention, the device being not provided with an output detector.
Figure 21:
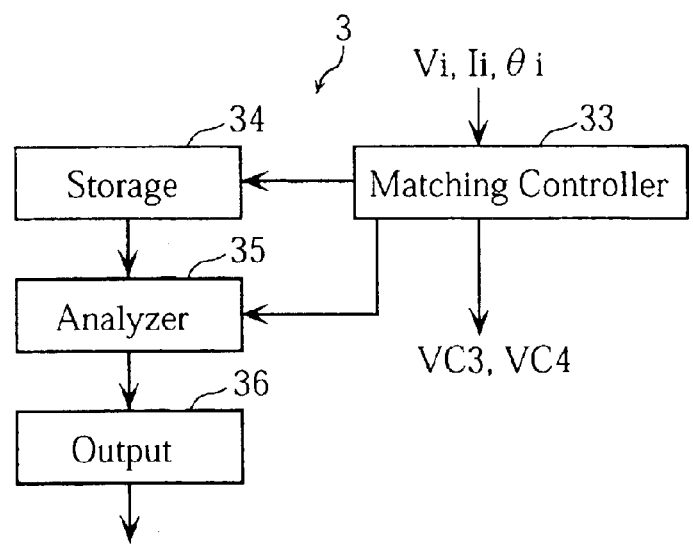
FIG. 21 is a block diagram showing the function of the controller of the matching device of FIG. 20.
Figure 22:
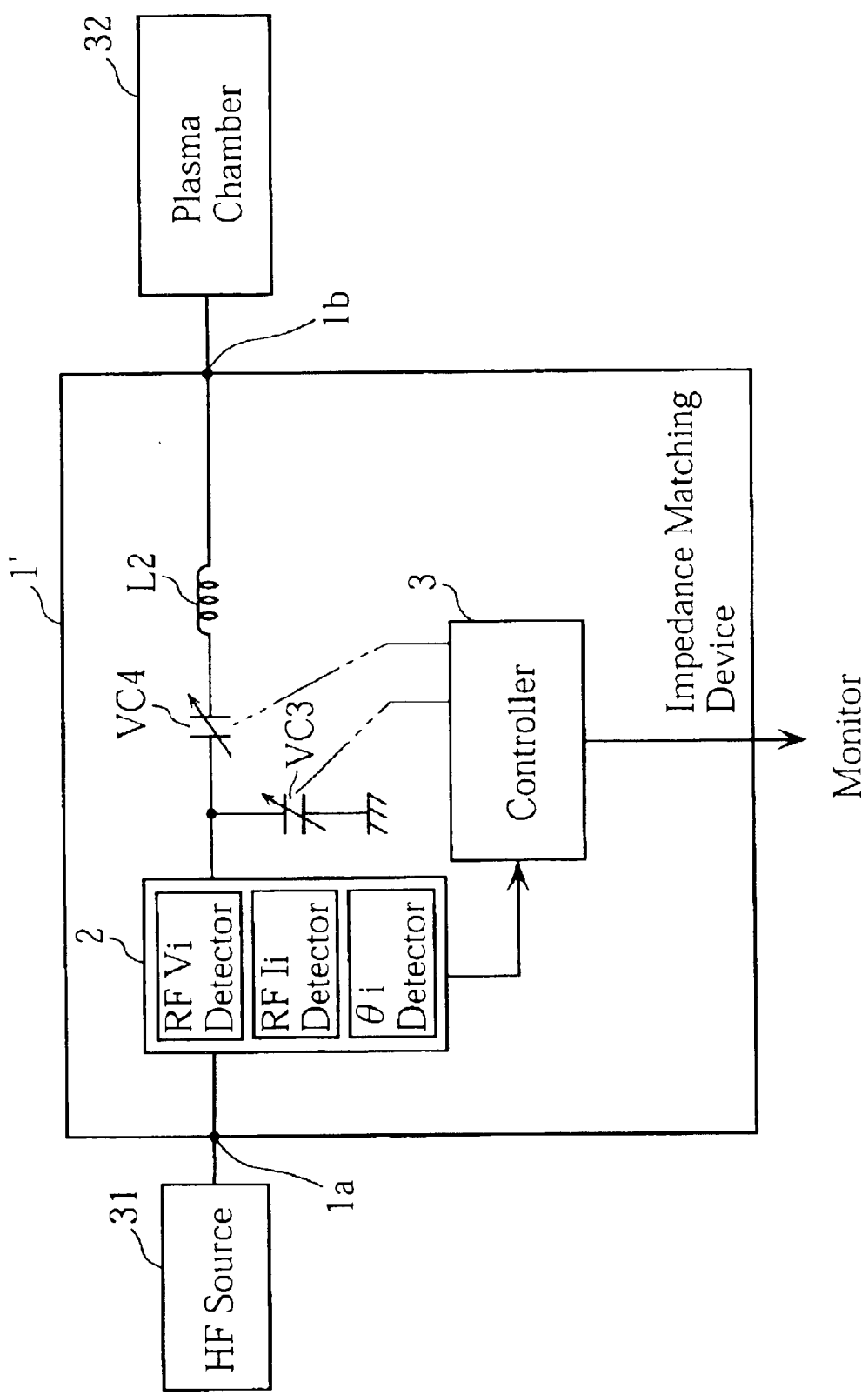
FIG. 22 shows how the matching device of FIG. 20 is actually used.
Figure 23:
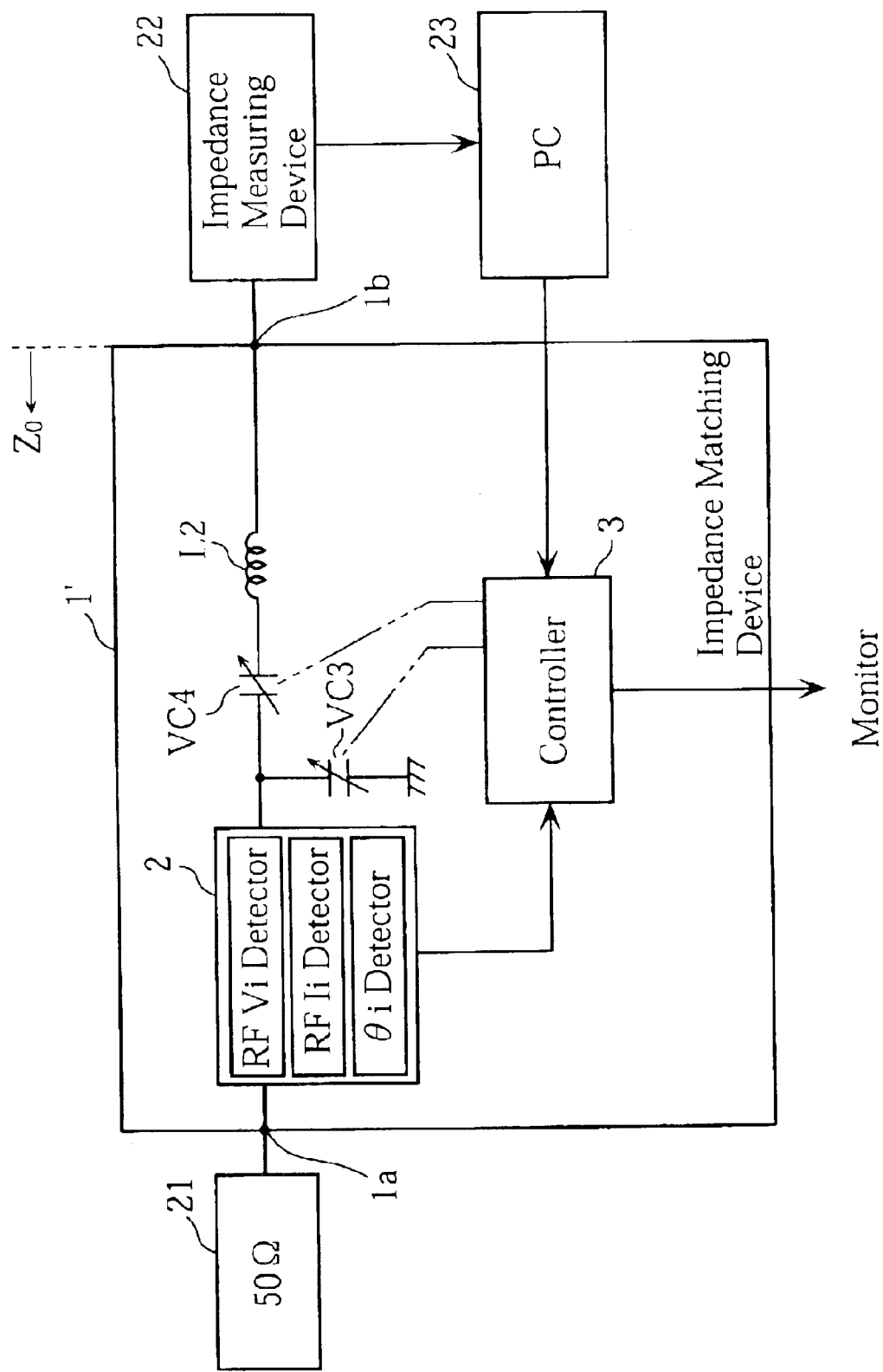
FIG. 23 illustrates a way to produce the data for calculating the output impedance with the use of the matching device of FIG. 20.
Figure 24:
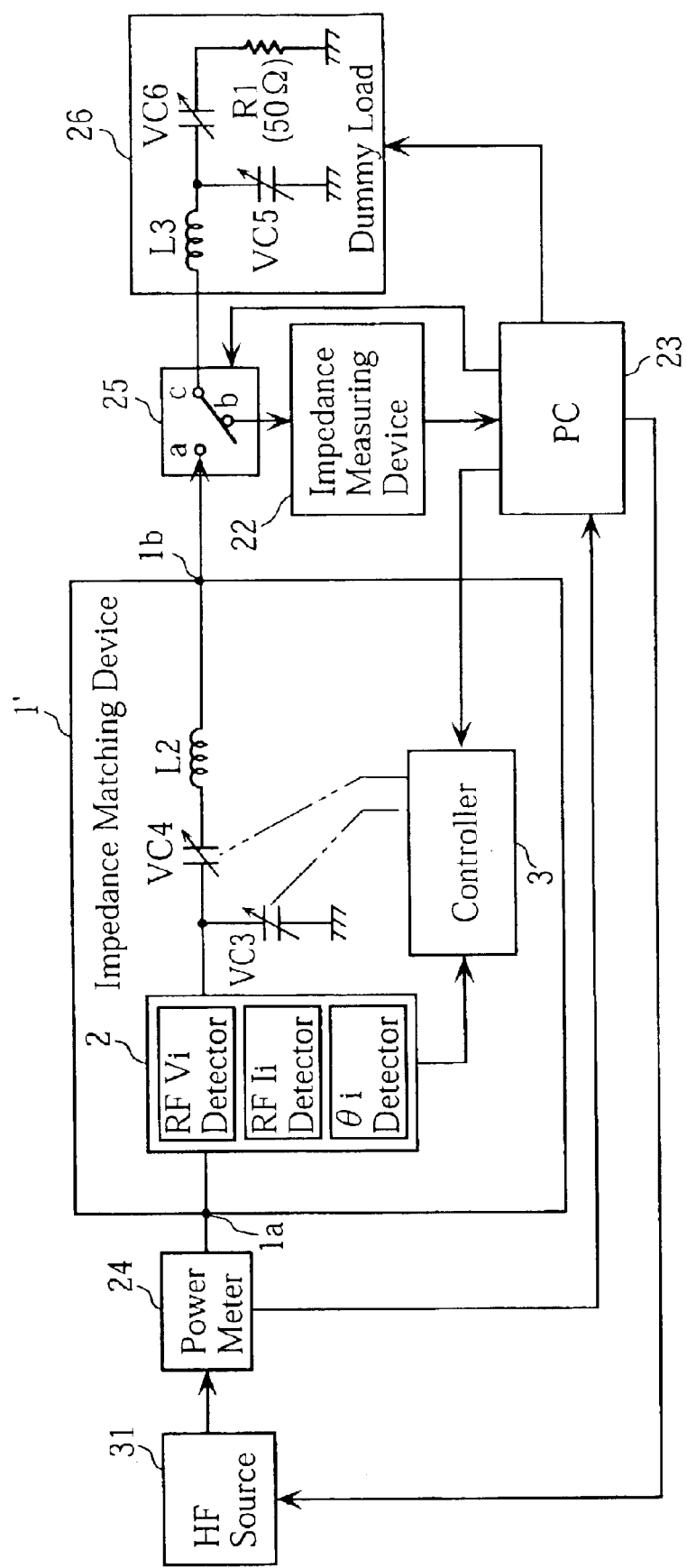
FIG. 24 illustrates another way to produce the data for calculating the output impedance with the use of the matching device of FIG. 20.
Figure 25:
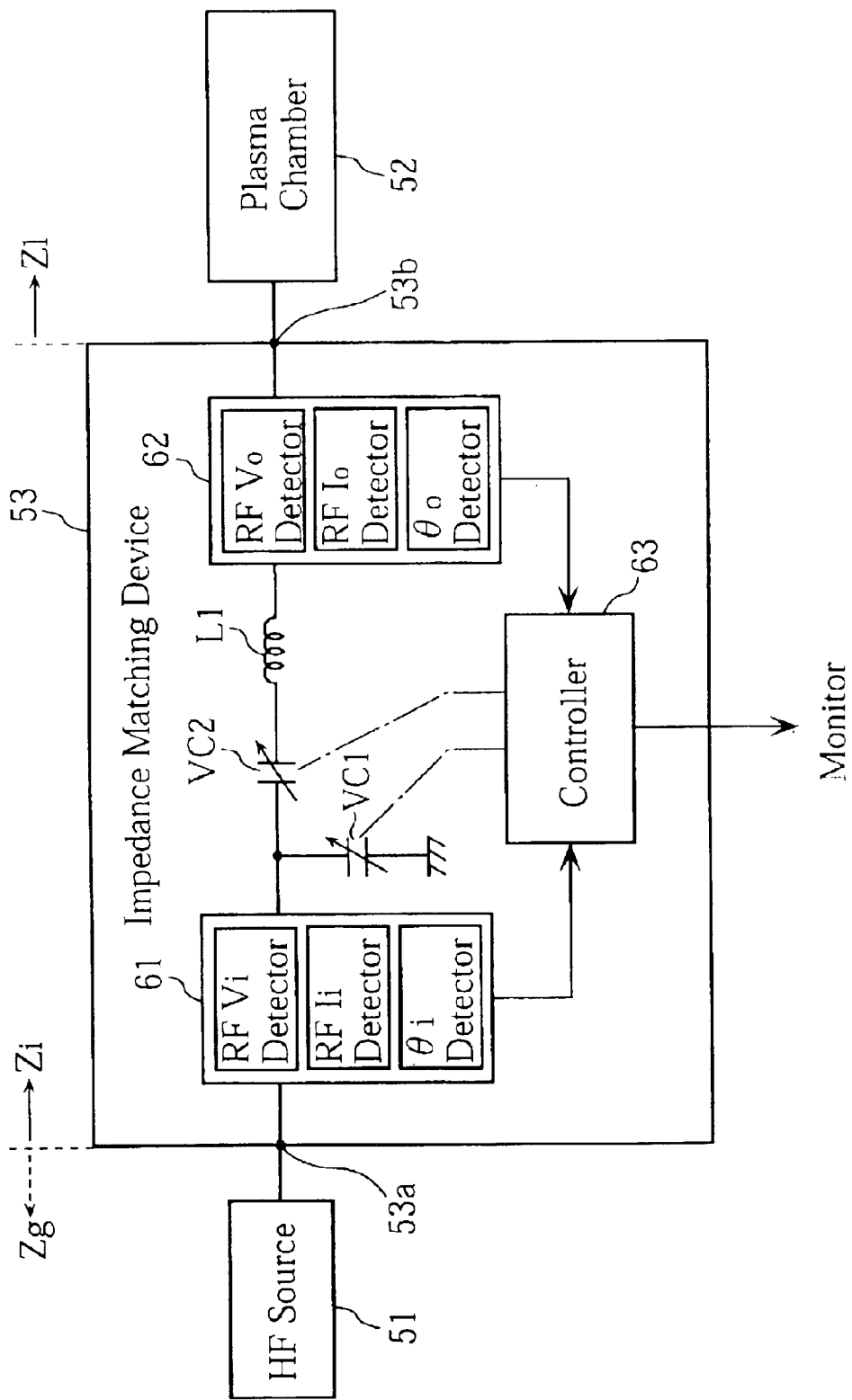
FIG. 25 shows how a conventional impedance matching device is actually used.

The RF voltage and current detectors 4, 5 do not directly take part in the impedance matching. Therefore, when there is no need to detect the voltage Vo or current Io, it is preferable not to provide the detectors 4, 5 so that the impedance matching device 1 can be made small in size and low in cost. FIG. 20 shows the arrangement of an impedance matching device 1' without having the detectors 4, 5. The function of the controller 3 is illustrated by a block diagram shown in FIG. 21. FIG. 22 shows the matching device 1' in use, with the power source 31 and the plasma chamber 32 connected.

In the matching device 1', the output impedance Zo and the Vo-Io phase difference θo are calculated on the basis of the capacitances C3, C4 adjusted for the impedance matching and of the capacitance-impedance table stored in the EEPROM 15. Specifically, the output impedance Zo is determined by reading out, from the EEPROM 15, the impedance Zo=Ro+jXo corresponding to the adjusted capacitances C3, C4. The phase difference θo is calculated by the formula (11) with the read-out values Ro, Xo substituted.

The calculation of the RF voltage Vo and the RF current Io is performed in the following manner. When the impedance matching by the matching device 1' is properly performed, it can be supposed that the RF electric power Pi inputted to the terminal 1a is transmitted to the output terminal 1b without significant loss. On this assumption, the phase difference θo is calculated, while the multitasking detector 2 detects the RF voltage Vi, the RF current Ii and the phase difference θi. The RF voltage Vo and the RF current Io will be calculated on the basis of the phase difference θo, the RF voltage Vi, the RF current Ii and the phase difference θi.

More specifically, the CPU 11 of the controller 3 calculates the power Pi (inputted to the terminal 1a) by the following formula (16) and the RF voltage Vi, RF current Ii and phase difference θi detected by the multitasking detector 2.

$$Pi = Vi \times Ii \times \cos(\theta i) \qquad (16)$$

Supposing that the loss within the impedance matching device 1' is negligible, the output power Po can be regarded as equal to the input power Pi. On this assumption, the CPU 11 calculates the RF voltage Vo and the RF current Io by the following formulas (17), (18).

$$Vo = \sqrt{(A \times Po/Ro)} = \sqrt{(A \times Pi/Ro)} \qquad (17)$$

$$Io = \sqrt{(Po/Ro)} = \sqrt{(Pi/Ro)} \qquad (18)$$

where A=(Ro)2+(Xo)2. The formulas (17), (18) can be derived from the following equations (19)~(21).

$$Po = Vo \times Io \times \cos(\theta o) \qquad (19)$$

$$Ro = Vo \times \cos(\theta o)/Io \qquad (20)$$

$$Xo = Vo \times \sin(\theta o)/Io \qquad (21)$$

In the above embodiment, the loss within the matching device 1' is supposed to be zero. However, when more precise RF voltage Vo, RF current Io and phase difference θo are desired, an estimation of the inner loss of the matching device 1' may be made on the basis of a predetermined formula. Then, with the estimated loss of the device 1' taken into consideration, the calculations of the electric characteristics are performed.

Further, it is possible to estimate the inner loss of the matching device 1' on the basis of the RF current Io at the output terminal 1b. In this case, the resistances of the elements constituting the matching device 1' may be measured in advance. The RF power Po at the output terminal 1b is equal to the input power Pi (at the terminal 1a) minus the inner loss of the device 1'.

It is possible to provide the above-described matching device 1' with the interpolation function, with the storage section 34 storing a capacitance-impedance table. The arrangement to enable the interpolation may be the same as the one shown in FIG. 6 except that the voltage Vo is not inputted to the analysis section 38.

The capacitance-impedance table may be stored in the computer 23, to be inputted to the matching device 1' when required. The arrangement of the controller of the matching device 1' may be the same as that shown in FIG. 13 except that the voltage Vo is not inputted to the analysis section 38.

According to the present invention, it is possible to use the externally connected computer 23 for analyzing the impedance matching device 1'. The arrangement of the system for analyzing the output characteristics may be the same as that shown in FIG. 14 except that the voltage Vo is not inputted to the output section 39.

In the above embodiments, the impedance of the conduction passage between the impedance matching device and the power source 31 or plasma chamber 32 is assumed to be negligible. Alternatively, when the impedance should be taken into consideration, it may be measured in advance, to be used as compensation data during the impedance matching procedure. In this manner, the monitoring of the system characteristics (e.g., the RF voltage applied to the plasma chamber 32) can be performed precisely.

In the above embodiments, all of the RF voltage Vi, the RF current Ii and the phase difference θi are measured by the multitasking detector 2. Alternatively, the detector 2 may be arranged to measure only the RF voltage Vi and the RF current Ii. In this case, the controller 3 calculates the phase difference θi based on the measured voltage and current.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. An impedance matching device comprising:
an input terminal connect to a high frequency power source;
an output terminal connected to a load;
a reactance circuit including at least one variable reactor, the circuit arranged between the input terminal and the output terminal;
an input detector that detects voltage and current of high frequency power inputted to the input terminal;
a matching controller that matches impedance of the power source and impedance of the load by adjusting reactance of the variable reactor based on data detected by the input detector; and
an analyzer that analyzes electric characteristics at the output terminal based on both data about the adjusted reactance of the variable reactor and a pre-obtained reactance-impedance data-when the impedance of the power source and the impedance of the load are matched to each other;
wherein the reactance-impedance data represents relations between data on a plurality of preselected reactances of the variable reactor and impedance data at the output terminal, the reactance-impedance data being produced with the input terminal connected to the power source or an equivalent of the power source before the output terminal is connected to the load.

2. The matching device according to claim 1, further comprising a storage that stores the reactance-impedance data.

3. The matching device according to claim 1, further comprising an input section for input of the reactance impedance data when the reactance-impedance data is externally supplied.

4. The matching device according to claim 1, further comprising an output section for output of the electric characteristics analyzed by the analyzer.

5. The matching device according to claim 1, further comprising an interpolation calculator for producing interpolation data by interpolation based on the reactance-impedance data, the interpolation data representing relations between data on reactances of the variable reactor and impedance at the output terminal, wherein the analyzer performs the analysis of the electric characteristics at the output terminal based on said adjusted reactance and either one of the reactance-impedance data and the interpolation data.

6. The matching device according to claim 1, wherein the analyzer calculates impedance as the electric characteristics at the output terminal.

7. The matching device according to claim 6, wherein the analyzer calculates, based on said calculated impedance and detection suits by the input detector, high frequency voltage or high frequency current as the electric characteristics at the output terminal.

8. The matching device according to claim 6, wherein the analyzer calculates, based on said calculated impedance, a phase difference between the high frequency voltage and the high frequency current at he output terminal, the analyzer further calculating, based on the high frequency voltage an the high frequency current detected by the input detector, input power at the input terminal, the analyzer further calculating, based on the input power and said calculated impedance, high frequency voltage or high frequency current at the output terminal on an assumption that the input power is transmitted to the output terminal without loss.

9. The matching device according to claim 1, further comprising an actuator for changing the reactance of the variable reactor, wherein the reactance-impedance data includes information about relations between a position of a movable member of the actuator and the impedance at the output terminal.

10. The matching device according to claim 1, wherein the impedance data included in the reactance-impedance data comprises impedance measured as viewed from the output terminal toward the power source.

11. The matching device according to claim 10, wherein the impedance data is obtained by measuring output impedance of the marching device using an impedance measuring device as the reactance of the variable reactor is changed, with the input terminal connected to a dummy load and the output terminal connected to the impedance measuring device.

12. The matching device according to claim 11, further comprising an interpolation calculator that produces output impedance interpolation data by interpolation using the output impedance measured by the impedance measuring device.

13. The matching device according to claim 12, wherein the interpolation includes proportional operation using the output impedance measured by the impedance measuring device.

14. The matching device according to claim 1, wherein the impedance data included in the reactance-impedance data comprises impedance measured as viewed from the output terminal toward the load.

15. The matching device according to claim 14, wherein the impedance data is obtained by connecting the power source to the input terminal via a power meter, connecting a variable dummy load to the output terminal, causing the power source to supply high frequency electric power, adjusting the variable dummy load so that electric power of a reflected wave is minimized for a given reactance of the variable reactor, and measuring the adjusted impedance of the dummy load by an impedance measuring device.

16. The matching device according to claim 15, further comprising an interpolation calculator for producing impedance interpolation data by interpolation based on the impedance measured by the impedance measuring device.

17. The matching device according to claim 1, further comprising an output detector for detecting either one of high frequency voltage and high frequency current outputted to the load from the output terminal, wherein the analyzer performs the analysis of the electric characteristics at the output terminal based on the data about said adjusted reactance, the reactance-impedance data and detection results by the output detector.

18. The matching device according to claim 17, further comprising an interpolation calculator that produces interpolation data representing relations between data on the reactance of the variable reactor and impedance data at the output terminal, the interpolation data being obtained by interpolation using the reactance-impedance data, wherein the analyzer performs the analysis of the electric characteristics at the output terminal based on detection results from the data on said adjusted reactance and either one of the reactance-impedance data and the interpolation data.

19. The matching device according to claim 17, further comprising an actuator for changing the reactance of the variable reactor, therein the reactance-impedance data includes information about relations between a position of a movable member of the actuator and the impedance at the output terminal.

20. The matching device according to claim 17, wherein the analyzer calculates impedance at the output terminal based on data about said adjusted reactance and the reactance-impedance data, the analyzer further calculating a phase difference between high frequency voltage and high frequency current at the output terminal based on the calculated impedance, the analyzer her calculating, based on the calculated phase difference, the calculated impedance and either one of the high frequency voltage and current detected by the output detector, the remaining one of the high frequency voltage and current.

21. The matching device according to claim 18, wherein the analyzer calculates impedance at the output terminal based on data about said adjusted reactance and either one of the reactance-impedance data and the interpolation data, the analyzer further calculating a phase difference between high frequency voltage and high frequency current at the output terminal based on the calculated impedance, the analyzer further calculating, based on the calculated phase difference, the calculated impedance and either one of the high frequency voltage and current detected by the output detector, the remaining one of the high frequency voltage and current.

22. An impedance matching system comprising an impedance matching unit and an output characteristics analyzing unit, wherein the matching unit includes: an input terminal connected to a high frequency power source; an output terminal connected to a load; at least one variable reactor arranged between the input terminal and the output terminal for matching impedances of the power source and the load; an input detector that detects voltage and current of high frequency power supplied from the power source; and a matching controller that matches the impedance of the power source and the impedance of the load by adjusting reactance of the variable reactor based on detection data from the input detector; and wherein the analyzing unit includes: a storage that stores reactance-impedance data representing relations between data on a plurality of preselected reactances of the variable reactor and data on impedance at the output terminal, the reactance-impedance data being produced with the input terminal connected to the power source or an equivalent of the power source before the output terminal is connected to the load; and an analyzer that analyzes electric characteristics at the output terminal based on both data about the reactance adjusted by the matching controller and the reactance-impedance data.

23. The system according to claim 22, wherein the analyzer of the analyzing unit performs the analysis of the electric characteristics at the output terminal based on data on the reactance adjusted by the matching controller, detection results from the input detector and the reactance-impedance data.

24. The system according to claim 22, further comprising an output detector arranged in the impedance matching unit for detecting either one of high frequency voltage and high frequency current outputted from the output terminal to the load.

25. The system according to claim 24, wherein the analyzer of the analyzing unit performs the analysis of the electric characteristics at the output terminal based on data on reactance adjusted by the matching controller, detection results from the output detector and the reactance-impedance data.

26. The system according to claim 22, wherein the electric characteristics at the output terminal includes at least one of output impedance of the matching unit, impedance of the load, high frequency voltage at the output terminal and high frequency current at the output terminal.

27. The system according to claim 22, further comprising a display arranged in the analyzing unit for visually presenting analysis data supplied from the analyzer.

28. A method of analyzing electric characteristics at an output terminal of an impedance matching device provide with an input terminal and a variable reactor arranged between the input terminal and the output terminal, the method comprising:

producing reactance-impedance data while the input terminal is connected to a high frequency power source or an equivalent of the power source and before the output terminal is connected to a load, the reactance-impedance data representing relations between data on a plurality of preselected reactances of the variable reactor and data on impedance at the output terminal, supplying high frequency electric power to the input terminal while the input terminal is connected to the power source and the output terminal is connected to the load, detecting high frequency voltage and high frequency current at the input terminal, adjusting reactance of the variable reactor based on data on the detected high frequency voltage and current, so at the impedance of the power source and the impedance of the load are matched to each other, and analyzing the electric characteristics at the output terminal by using data on the adjusted reactance and the reactance-impedance data.

29. The method according to claim 28, wherein the analysis of the electric characteristics at the output terminal is performed based on data on the high frequency voltage and current detected at the input terminal, data on the adjusted reactance and the reactance-impedance data.

30. The method according to claim 28, further comprising detecting either one of high frequency voltage and high frequency current at the output terminal, wherein the analysis of the electric characteristics at the output terminal is performed based on detection data at the output terminal, data on the adjusted reactance and the reactance-impedance data.

* * * * *